US008739002B2

(12) United States Patent
Nakamura et al.

(10) Patent No.: US 8,739,002 B2
(45) Date of Patent: May 27, 2014

(54) DECODER, PERPENDICULAR MAGNETIC RECORDING AND REPRODUCING DEVICE, RECEIVING DEVICE, AND DECODING METHOD

(75) Inventors: Yasuaki Nakamura, Matsuyama (JP); Yoshihiro Okamoto, Matsuyama (JP); Hisashi Osawa, Matsuyama (JP)

(73) Assignee: Ehime University, Matsuyama-shi (JP)

( * ) Notice: Subject to any disclaimer, the term of this patent is extended or adjusted under 35 U.S.C. 154(b) by 328 days.

(21) Appl. No.: 13/000,717

(22) PCT Filed: Dec. 26, 2008

(86) PCT No.: PCT/JP2008/073794
§ 371 (c)(1),
(2), (4) Date: Dec. 22, 2010

(87) PCT Pub. No.: WO2010/001502
PCT Pub. Date: Jan. 7, 2010

(65) Prior Publication Data
US 2011/0107178 A1    May 5, 2011

(30) Foreign Application Priority Data

Jun. 30, 2008 (JP) ................................. 2008-171121

(51) Int. Cl.
*H03M 13/00*    (2006.01)
(52) U.S. Cl.
USPC ............................ 714/779; 711/118; 711/162
(58) Field of Classification Search
USPC .......... 714/755, 786, 762, 788, 784, 794–795
See application file for complete search history.

(56) References Cited

U.S. PATENT DOCUMENTS

| 7,237,173 | B2 | 6/2007 | Morita et al. |
| 7,516,392 | B2 | 4/2009 | Tonami et al. |
| 8,266,502 | B2 | 9/2012 | Harada et al. |
| 8,473,823 | B2 | 6/2013 | Okamura et al. |
| 2003/0043487 | A1 | 3/2003 | Morita et al. |

(Continued)

FOREIGN PATENT DOCUMENTS

| JP | 2003-68024 (A) | 3/2003 |
| JP | 2005-166089 (A) | 6/2005 |

(Continued)

OTHER PUBLICATIONS

Yasuaki Nakamura et al., A Study of LDPC Coding and Iterative Decoding System Using Burst Information, IEICE Technical Report, Dec. 2005, pp. 1-6.

(Continued)

*Primary Examiner* — Guy Lamarre
(74) *Attorney, Agent, or Firm* — Foley & Lardner LLP

(57) ABSTRACT

An objective of the present invention is to provide a decoder, a perpendicular magnetic recording and reproducing device, a receiving device, and a decoding method that are used for performing decoding resistant to burst errors such as a pole-erase phenomenon, where the burst errors do not have amplitude fluctuation, without the addition of a special code (redundant code) for detecting burst errors. The present invention is a decoder, a perpendicular magnetic recording and reproducing device, a receiving device, and a decoding method that perform a decoding process on an encoded data signal, wherein a parity check is performed on the encoded data signal that is encoded with a low density parity check code to output burst information.

20 Claims, 20 Drawing Sheets

(56) References Cited

U.S. PATENT DOCUMENTS

| | | | |
|---|---|---|---|
| 2004/0054651 A1* | 3/2004 | Katayama et al. | 707/1 |
| 2004/0148561 A1* | 7/2004 | Shen et al. | 714/803 |
| 2004/0186992 A1* | 9/2004 | Matsumoto | 713/161 |
| 2005/0003769 A1* | 1/2005 | Foerster et al. | 455/113 |
| 2005/0120286 A1 | 6/2005 | Akamatsu | |
| 2006/0224934 A1* | 10/2006 | Cameron et al. | 714/752 |
| 2007/0110188 A1 | 5/2007 | Esumi et al. | |
| 2008/0040651 A1 | 2/2008 | Kanaoka et al. | |
| 2009/0158125 A1 | 6/2009 | Harada et al. | |
| 2010/0091629 A1* | 4/2010 | Tan et al. | 369/53.44 |
| 2011/0138258 A1 | 6/2011 | Okamura et al. | |

FOREIGN PATENT DOCUMENTS

| | | |
|---|---|---|
| JP | 2006-139815 (A) | 6/2006 |
| JP | 2007-87530 (A) | 4/2007 |
| JP | 2008-65969 (A) | 3/2008 |
| JP | 2009-077391 A | 4/2009 |
| JP | 2009-146494 A | 7/2009 |

OTHER PUBLICATIONS

Yasuaki Nakamura et al., Performance Comparison of Error Correcting Code in Perpendicular Magnetic Recording with Burst-like Signal Degradation, IEICE Technical Report, Jun. 2007, pp. 55-60.

R. G. Gallager, Low-Density Parity-Check Codes, IRE Transactions on Information Theory, 1962, pp. 21-28.

Frank R. Kschischang et al., Factor Graphs and the Sum-Product Algorithm, IEEE Transactions on Information Theory, vol. 47, No. 2, Feb. 2001, pp. 498-519.

D.J.C. MacKay et al., Near Shannon Limit Performance of Low Density Parity Check Codes, Electronic Letters, vol. 32, No. 18, Aug. 1996, pp. 1645-1646.

Sae-Young Chung et al., On the Design of Low-Density Parity-Check Codes Within 0.0045 dB of the Shannon Limit, IEEE Communications Letters, vol. 5, No. 2, Feb. 2001, pp. 58-60.

Tadashi Wadayama, Iterative Decoding Algorithm for Channel with Burst Errors, The Transactions of the Institute of Electronics Information and Communication Engineers, D-II, No. 2, 2005, pp. 170-187.

Yasuaki Nakamura et al. Performance Evaluation of LDPC Coding and Iterative Decoding System Using Burst Information, The Transactions of the Institute of Electronics Information and Communication Engineers, C vol. J90-C, No. 5, 2007, pp. 437-446.

Yasuaki Nakamura et al., A Study of Error Correction Ability of LDPC Code for Perpendicular Magnetic Recording Channel with Burst-like Signal Degradation, IEICE Technical Report, 2007, pp. 19-24.

Hidetoshi Saito et al., Construction of High Efficient Run Length Limited Codes and Its Performance Evaluation, The Transactions of the Institute of Electronics Information and Communication Engineers, C vol. J86-C, No. 8, 2003, pp. 952-961.

Toshihiko Morita et al., ECC-Less LDPC Coding for Magnetic Recording Channels, IEEE Transactions on Magnetics, vol. 38, No. 5, Sep. 2002, pp. 2304-2306.

Yoshihiro Okamoto et al., A Study on 3/4 MTR Coded PRML Systems in Perpendicular Recording Using Double Layered Medium, Technical Report of IEICE, Jun. 2000, pp. 1-6.

Yasuaki Nakamura et al., A Study of Turbo Decoding With Embedded AR Channel Model for Perpendicular Recording, IEEE Transactions on Magnetics, vol. 39, No. 5, Sep. 2003, pp. 2570-2572.

Patrick Robertson et al., A Comparison of Optimal and Sub-Optimal MAP Decoding Algorithms Operating in the Log Domain, IEEE, 1995, pp. 1009-1013.

Aleksandar Kavcic et al., A Signal-Dependent Autoregressive Channel Model, IEEE Transactions on Magnetics, Sep. 1999, 3 pages.

Rüdiger Berger et al., A Test System for Automated Characterization of Performance Relevant Storage Media Defects, IEEE Transactions of Magnetics, vol. 38, No. 5, Sep. 2002, pp. 2435-2437.

Weijun Tan et al., Array Codes for Erasure Correction in Magnetic Recording Channels, IEEE Transactions on Magnetics, vol. 39, No. 5, Sep. 2003, pp. 2579-2581.

K. Nakamoto et al., Single-Pole/TMR Heads for 140=Gb/$in^2$Perpendicular Recording, IEEE Transactions on Magnetics, vol. 40, No. 1, Jan. 2004, pp. 290-294.

Y. Nakamura et al., A Study of Error Correction System for PMR Channel With Bit Flipping Burst, Proceedings of the IEICE General Conference, 2008, pp. 45.

T. Wadayama, Low Density Parity Check Codes and Decoding Thereof—LDPC Code/Sum-Product Decoding, Triceps, Jun. 2002, pp. 18-22.

Y. Nakamura et al., Performance Evaluation of Burst Detector for PMR Chanel with Media Defect, Proceedings of the 2008 IEICE General Conference, 2008, p. 46.

Y Nakamura et al., A New Burst Detection Method Using Parity Check Matrix of LDPC Code for Bit Flipping Burst-like Signal Degradation, Intermag Europe International Magnetics Conference, 2008, p. 1410.

Y. Nakamura et al., A Study on Burst Detector Using Parity Check Matrix of LDPC Code, IEICE Technical Report, MR2008-7, vol. 108, No. 81 Jun. 2008, pp. 35-40.

E. R. Kretzmer, Generalization of a Technique for Binary Data Communication, IEEE Trans. Commun. Technol., Feb. 1966, pp. 67-68, vol. COM-14.

Yasuaki Nakamura et al., A Study on Burst Detection Using Parity Check Matrix of LDPC Code, IEICE Technical Report, Jan. 2008, pp. 7-12, vol. 107, No. 424.

* cited by examiner

DECODER, PERPENDICULAR MAGNETIC RECORDING AND REPRODUCING DEVICE, RECEIVING DEVICE, AND DECODING METHOD

TECHNICAL FIELD

The present invention relates to a decoder, a perpendicular magnetic recording and reproducing device, a receiving device, and a decoding method. More particularly, the present invention relates to a decoder, a perpendicular magnetic recording and reproducing device, a receiving device, and a decoding method that are used for detecting a burst error from an encoded data signal that is encoded with a low density parity check code.

BACKGROUND ART

In a low density parity check (LDPC) coding scheme, it is conventionally known that a high decoding gain is obtained and thus decoding characteristics extremely close to the Shannon limit are obtained by performing iterative decoding on an encoded data signal by using an SP (sum-product) algorithm or the like.

In the low density parity check (LDPC) coding scheme, it is known that, although decoding performance for random errors is extremely good, decoding performance for continuous (burst) errors (burst errors) is extremely bad. In other words, a conventional LDPC coding and iterative decoding system has a problem in that iterative decoding performed during the process of decoding an LDPC code causes the propagation (dispersion) of erroneous data that occurs during a burst error interval and thus decoding performance (error correction performance) is significantly decreased.

Therefore, there is a need for a method for detecting and specifying a burst error interval in some way and performing decoding that is resistant to burst errors, thereby suppressing the propagation (dispersion) of errors during the process of decoding. It should be noted that burst errors means errors that are continuous over long-interval data. Depending on the generation mechanism, in a magnetic recording and reproducing system such as a hard disk drive, there are burst errors such as a medium deficit, a thermal asperity caused by a head crash, or a pole-erase phenomenon caused by overwriting from an adjacent track due to residual magnetism.

Patent Document 1 discloses a data storage device that determines whether log likelihood ratio (LLR) information output from a channel decoder that is an iterative decoder that performs an iterative decoding process on encoded data obtained by further adding an RLL (Run-Length Limited) code violates the RLL code side in order to detect a burst error interval and that attenuates a log likelihood ratio corresponding to the detected burst error interval in order to perform adjustment.

Moreover, Patent Document 2 discloses a recording and reproducing device that detects the generation of a thermal asperity in response to the fluctuation of signal amplitude, outputs an erasure flag signal, and masks channel information to perform iterative calculations over the time period for which the erasure flag is on, thereby not requiring an ECC (Error Correcting Code).

Moreover, Patent Document 3 discloses a decoder that determines whether each data of each block is true or not based on hard information according to an ECC code with respect to encoded data obtained by further adding the ECC code to the encoded data and that replaces the likelihood of each data of a block for which the determination value is true (without error) with a maximum value.

Moreover, Non-Patent Documents 1 and 2 disclose a decoding method for detecting the degradation of regeneration amplitude in order to specify a burst error interval and for performing a manipulation by which the LLR of the burst error interval is set to zero in order to suppress the propagation of errors during the process of iterative decoding. For this decoding method, it is assumed that a medium defect causes the burst errors.

[Patent Document 1] Japanese Patent Application Laid-open No. 2005-166089
[Patent Document 2] Japanese Patent Application Laid-open No. 2003-68024
[Patent Document 3] Japanese Patent Application Laid-open No. 2008-65969
[Non-Patent Document 1] Yasuaki Nakamura et al., "A Study on LDPC Coding and Iterative Decoding System using Burst Information", Dec. 8, 2005, IEICE technical report. Magnetic recording, Vol. 105, No. 473, pp. 1 to 6
[Non-Patent Document 2] Yasuaki Nakamura et al., "Performance Comparison of Error Correction Code in Perpendicular Magnetic Recording and Reproducing Systems with Burst", May 31, 2007, IEICE technical report. Magnetic recording, Vol. 107, No. 84, pp. 55 to 60

DISCLOSURE OF INVENTION

Problem to be Solved by the Invention

However, there is a problem in that a conventional decoder does not have a burst error detecting means that can be widely applied to various burst errors such as a medium deficit, a thermal asperity, and a pole-erase phenomenon without adding a special code (redundant code) for detecting burst errors.

For example, the recording and reproducing device disclosed in Patent Documents 1 and 3 has a problem in that a special code (redundant code) such as an RLL code or an ECC code must be further added in order to detect burst errors and thus a degradation of memory capacity and an increase in processing time are caused.

Moreover, the conventional techniques disclosed in Patent Document 2 and Non-Patent Documents 1 and 2 have a problem in that, while burst errors caused by a thermal asperity or a medium defect with amplitude fluctuation can be specified by detecting an increase in signal amplitude or a degradation of regeneration amplitude, burst errors without amplitude fluctuation, like a pole-erase phenomena or the like, cannot be detected.

The present invention has been achieved in view of the above problems, and an objective of the invention is to provide a decoder, a perpendicular magnetic recording and reproducing device, a receiving device, and a decoding method that are used for performing decoding resistant to burst errors such as a pole-erase phenomenon, where the burst errors do not have amplitude fluctuation, without the addition of a special code (redundant code) for detecting burst errors.

Means for Solving Problem

To achieve such a objective, according to one aspect of the present invention, a decoder that performs a decoding process on an encoded data signal, includes a burst detecting unit that performs a parity check on the encoded data signal that is encoded with a low density parity check code and outputs burst information.

According to an embodiment of this invention, the decoder performs a decoding process on an encoded data signal, by performing a parity check on the encoded data signal that is encoded with a low density parity check code to output burst information, thereby enabling to perform decoding that is resistant to burst errors without amplitude fluctuation without adding a special code (redundant code) for detecting burst errors. In other words, bit-flipping-like burst errors in which the position of a burst cannot be specified from signal amplitude and so on, like a pole-erase phenomenon, can be also detected, and coding other than low density parity check coding and decoding for the coding are not required to detect a burst, thus a degradation of memory capacity and an increase in processing time can be suppressed.

According to another aspect of the present invention of the decoder, the burst information includes information by which a position and a length of a burst error of the encoded data signal are specified.

According to an embodiment of this invention, the burst information includes information by which a position and a length of a burst error of the encoded data signal are specified, thereby enabling to suppress the propagation (dispersion) of erroneous data of a burst error interval corresponding to the position and length of burst errors based on the burst information during the process of iterative decoding.

According to still another aspect of the present invention of the decoder, the burst detecting unit performs the parity check on the encoded data signal for each row of a parity check matrix, adds up a number of bits "1" of a row detected as an error in the parity check for each of columns of the parity check matrix corresponding to bits of the encoded data signal, specifies the position and the length of the burst error of the encoded data signal in accordance with a distribution of the added-up number, and generates and outputs the burst information.

According to an embodiment of this invention, the parity check is performed on the encoded data signal for each row of a parity check matrix, a number of bits "1" of a row detected as an error in the parity check is added up for each of columns of the parity check matrix corresponding to bits of the encoded data signal, the position and the length of the burst error of the encoded data signal are specified in accordance with a distribution of the added-up number to generate and output the burst information, thereby enabling to eligibly specify a burst error interval based on the parity check matrix of a low density parity check code.

According to still another aspect of the present invention, the decoder further includes a decoding unit that suppresses a rise of a likelihood of each bit of the encoded data signal corresponding to the position and the length of the burst error to perform an iterative decoding process based on the burst information output from the burst detecting unit.

According to an embodiment of this invention, during performing an iterative decoding process, a rise of a likelihood of each bit of the encoded data signal corresponding to the position and the length of the burst error is suppressed based on the burst information output from the burst detecting unit, thereby enabling to suppress the propagation of errors caused by burst errors to further improve decoding performance.

According to still another aspect of the present invention of the decoder, the burst detecting unit includes a hard decision unit that performs a hard decision on a decoded result output from the decoding unit, a parity flag generating unit that performs a parity check on the decoded result hard-decided by the hard decision unit based on a parity check matrix and generates a parity flag, a filter output unit that applies the parity flag generated from the parity flag generating unit to a moving average filter to output a filter output, and a burst information output unit that performs a threshold decision on the filter output of the filter output unit to specify the position and the length of the burst error and outputs the burst information to the decoding unit.

According to an embodiment of this invention, the encoder performs a hard decision on a decoded result output from the decoding unit, performs a parity check on the decoded result hard-decided based on a parity check matrix to generate a parity flag, applies the generated parity flag to a moving average filter to output a filter output, performs a threshold decision on the filter output to specify the position and the length of the burst error, and outputs the burst information to the decoding unit, thereby enabling to specify the position and length of burst errors to perform decoding resistant to burst errors.

According to still another aspect of the present invention of the decoder, the filter output unit applies the parity flag to the moving average filters through multiple stages.

According to an embodiment of this invention, the parity flag is applied to the moving average filters through multiple stages, whereby enabling to detect a short bit-flipping-like signal burst to perform decoding that is also resistant to short burst errors.

According to still another aspect of the present invention of the decoder, the filter output unit applies the parity flag to the moving average filter that outputs a moving average of an interval longer than that of the applied moving average filter to again output a filter output when the length of the burst error specified by performing the threshold decision on the filter output by the burst information output unit is not less than a predetermined value.

According to an embodiment of this invention, when the length of the burst error specified by performing the threshold decision on the filter output is not less than a predetermined value, the parity flag is applied to the moving average filter that outputs a moving average of an interval longer than that of the applied moving average filter to again output a filter output, thereby enabling to detect burst errors with high precision by using a moving average filter corresponding to the length of the burst errors.

According to still another aspect of the present invention of the decoder, the decoding unit includes an APP (a posteriori probability) decoder that performs a posteriori probability decoding process on the encoded data signal and outputs the decoded result including the likelihood, and an SP (sum-product) decoder that suppresses the rise of the likelihood output from the APP decoder based on the burst information output from the burst detector, performs the iterative decoding process on the decoded result output from the APP decoder, and outputs a decoded result including the updated likelihood as an input of the APP decoder.

According to an embodiment of this invention, the decoder includes an APP decoder that performs a posteriori probability decoding process on the encoded data signal and outputs the decoded result including the likelihood, and an SP decoder that suppresses the rise of the likelihood output from the APP decoder based on the burst information output from the burst detector, performs the iterative decoding process on the decoded result output from the APP decoder, and outputs a decoded result including the updated likelihood as an input of the APP decoder, whereby enabling to perform high-precision decoding resistant to burst errors in accordance with the appropriate combination of an inner decoder and an outer decoder.

According to still another aspect of the present invention of the decoder, the SP decoder suppresses the rise of the likelihood output from the APP decoder by using weighting based on the burst information.

According to an embodiment of this invention, the rise of the likelihood output from the APP decoder is suppressed by using weighting based on the burst information, whereby enabling to suppress the propagation of errors caused by burst errors by appropriate weighting to further improve decoding performance.

According to still another aspect of the present invention of the decoder, the encoded data signal is further encoded with an RS (Reed-Solomon) code, and the decoder further includes an RS decoder that performs decoding of the RS code on the output of the decoding unit.

According to an embodiment of this invention, an RS decoder that performs decoding of the RS code on the output of the decoding unit is further included, whereby enabling to perform decoding resistant to burst errors even if a short bit-flipping-like signal burst occurs.

According to still another aspect of the present invention of the decoder, the burst error is caused by an effect that a medium defect and a bit-flipping-like signal burst occur at the same time.

According to an embodiment of this invention, burst errors can be detected even if a medium defect and a bit-flipping-like signal burst occur at the same time.

The present invention is also related to a perpendicular magnetic recording and reproducing device including the above-described decoder.

According to an embodiment of this invention, in a perpendicular magnetic recording and reproducing system having a bit-flipping-like signal burst that cannot be easily detected from a regeneration waveform or the output of an APP decoder, the perpendicular magnetic recording and reproducing device resistant to burst errors can be provided.

The present invention is also related to a receiving device including the above-described decoder.

According to an embodiment of the present invention, the receiving device resistant to burst errors can be provided for communication that uses a binary-input additive white Gaussian channel or the like.

Moreover, according to an embodiment of the present invention, a decoding method for performing a decoding process on an encoded data signal includes a burst detecting step of outputting burst information by performing a parity check on the encoded data signal encoded with a low density parity check code.

According to an embodiment of this invention, the decoding method includes performing a decoding process on an encoded data signal, by performing a parity check on the encoded data signal that is encoded with a low density parity check code to output burst information, thereby enabling to perform decoding that is resistant to burst errors without amplitude fluctuation without adding a special code (redundant code) for detecting burst errors. In other words, bit-flipping-like burst errors in which the position of a burst cannot be specified from signal amplitude and so on, like a pole-erase phenomenon, can be also detected, and coding other than low density parity check coding and decoding for the coding are not required to detect a burst, thus a degradation of memory capacity and an increase in processing time can be suppressed.

According to another aspect of the present invention of the decoding method, the burst information includes information by which a position and a length of a burst error of the encoded data signal are specified.

According to an embodiment of this invention, the burst information includes information by which a position and a length of a burst error of the encoded data signal are specified, thereby enabling to suppress the propagation (dispersion) of erroneous data of a burst error interval corresponding to the position and length of burst errors based on the burst information during the process of iterative decoding.

According to still another aspect of the present invention of the decoding method, at the burst detecting step, the parity check is performed on the encoded data signal for each row of a parity check matrix, a number of bits "1" of a row detected as an error in the parity check is added up for each of columns of the parity check matrix corresponding to bits of the encoded data signal, the position and the length of the burst error of the encoded data signal are specified in accordance with a distribution of the added-up number to generate and output the burst information.

According to an embodiment of this invention, the parity check is performed on the encoded data signal for each row of a parity check matrix, a number of bits "1" of a row detected as an error in the parity check is added up for each of columns of the parity check matrix corresponding to bits of the encoded data signal, and the position and the length of the burst error of the encoded data signal are specified in accordance with a distribution of the added-up number to generate and output the burst information, thereby enabling to eligibly specify a burst error interval based on the parity check matrix of a low density parity check code.

According to still another aspect of the present invention, the decoding method further includes a decoding step of suppressing a rise of a likelihood of each bit of the encoded data signal corresponding to the position and the length of the burst error to perform an iterative decoding process based on the burst information output at the burst detecting step.

According to an embodiment of this invention, during performing an iterative decoding process, a rise of a likelihood of each bit of the encoded data signal corresponding to the position and the length of the burst error is suppressed based on the burst information output from the burst detecting unit, thereby enabling to suppress the propagation of errors caused by burst errors to further improve decoding performance.

According to still another aspect of the present invention of the decoding method, the burst detecting step includes a hard decision step of performing a hard decision on a decoded result output at the decoding step, a parity flag generating step of performing a parity check on the decoded result hard-decided at the hard decision step based on a parity check matrix to generate a parity flag, a filter output step of applying the parity flag generated at the parity flag generating step to a moving average filter to output a filter output, and a burst information output step of performing a threshold decision on the filter output of the filter output step to specify the position and the length of the burst error to output the burst information to the decoding step.

According to an embodiment of this invention, the encoding method includes performing a hard decision on a decoded result output from the decoding unit, performing a parity check on the decoded result hard-decided based on a parity check matrix to generate a parity flag, applying the generated parity flag to a moving average filter to output a filter output, and performing a threshold decision on the filter output to specify the position and the length of the burst error to output the burst information for the decoding step, thereby enabling to specify the position and length of burst errors to perform decoding resistant to burst errors.

According to still another aspect of the present invention of the decoding method, at the filter output step, the parity flag is applied to the moving average filters through multiple stages.

According to an embodiment of this invention, the parity flag is applied to the moving average filters through multiple stages, whereby enabling to detect a short bit-flipping-like signal burst to perform decoding that is also resistant to short burst errors.

According to still another aspect of the present invention of the decoding method, at the filter output step, the parity flag is applied to the moving average filter that outputs a moving average of an interval longer than that of the applied moving average filter to again output a filter output when the length of the burst error specified by performing the threshold decision on the filter output is not less than a predetermined value.

According to an embodiment of this invention, when the length of the burst error specified by performing the threshold decision on the filter output is not less than a predetermined value, the parity flag is applied to the moving average filter that outputs a moving average of an interval longer than that of the applied moving average filter to again output a filter output, thereby enabling to detect burst errors with high precision by using a moving average filter corresponding to the length of the burst errors.

According to still another aspect of the present invention of the decoding method, the decoding step includes an APP (a posteriori probability) decoding step of performing a posteriori probability decoding process on the encoded data signal to output the decoded result including the likelihood, and an SP (sum-product) decoding step of suppressing the rise of the likelihood output at the APP decoding step based on the burst information output at the burst detecting step to perform the iterative decoding process on the decoded result output at the APP decoding method to output a decoded result including the updated likelihood as an input for the APP decoding step.

According to an embodiment of this invention, the decoding method includes performing a posteriori probability decoding process on the encoded data signal to output the decoded result including the likelihood, suppressing the rise of the likelihood based on the burst information output at the burst detecting step to perform the iterative decoding process on the decoded result output at the APP decoding step, and outputting a decoded result including the updated likelihood as an input of the APP decoding process, whereby enabling to perform high-precision decoding resistant to burst errors in accordance with the appropriate combination of inner decoding process and outer decoding process.

According to still another aspect of the present invention of the decoding method, at the SP decoding step, the rise of the likelihood output at the APP decoding method is suppressed by using weighting based on the burst information.

According to an embodiment of this invention, the rise of the likelihood output at the APP decoding step is suppressed by using weighting based on the burst information, whereby enabling to suppress the propagation of errors caused by burst errors by appropriate weighting to further improve decoding performance.

According to still another aspect of the present invention of the decoding method, the encoded data signal is further encoded with an RS (Reed-Solomon) code, and the decoding method further includes an RS decoding step of performing decoding of the RS code on the output of the decoding step.

According to an embodiment of this invention, an RS decoder that performs decoding of the RS code on the output of the decoding step is further included, whereby enabling to perform decoding resistant to burst errors even if a short bit-flipping-like signal burst occurs.

According to still another aspect of the present invention of the decoding method, the burst error is caused by an effect that a medium defect and a bit-flipping-like signal burst occur at the same time.

According to an embodiment of this invention, burst errors can be detected even if a medium defect and a bit-flipping-like signal burst occur at the same time.

Effect of the Invention

According to an embodiment of the present invention, an effect that decoding resistant to burst errors such as a pole-erase phenomenon can be performed is achieved, where the burst errors do not have amplitude fluctuation, without the addition of a special code (redundant code) for detecting burst errors.

EXPLANATIONS OF
LETTERS OR NUMERALS

| | |
|---|---|
| 60 | decoder |
| 601 | iterative decoder |
| 61 | burst detecting unit |
| 61' | burst detector |
| 611 | hard decision unit |
| 611' | hard decision decoder |
| 612 | parity flag generating unit |
| 612' | parity flag generator |
| 613 | filter output unit |
| 613' | filter |
| 614 | burst information output unit |
| 614' | burst information output device |
| 65 | decoding unit |
| 62 | APP decoder |
| 63 | SP decoder |
| 64 | hard decision decoder |
| 66 | RS decoder |
| 67 | RLL decoder |
| 30 | RLL encoder |
| 31 | LDPC encoder |
| 32 | burst generator |
| 33 | RS encoder |
| 401 | PR1 channel |
| 402 | AWGN channel |
| 41 | magnetic recording medium (disk) |
| 42 | equalizer |

BEST MODE(S) FOR CARRYING OUT THE INVENTION

Embodiments of a decoder, a perpendicular magnetic recording and reproducing device, a receiving device, and a decoding method according to the present invention will be explained in detail with reference to the accompanying drawings. The present invention is not limited to the embodiments.

[Configuration of Decoder]

Figure 1:
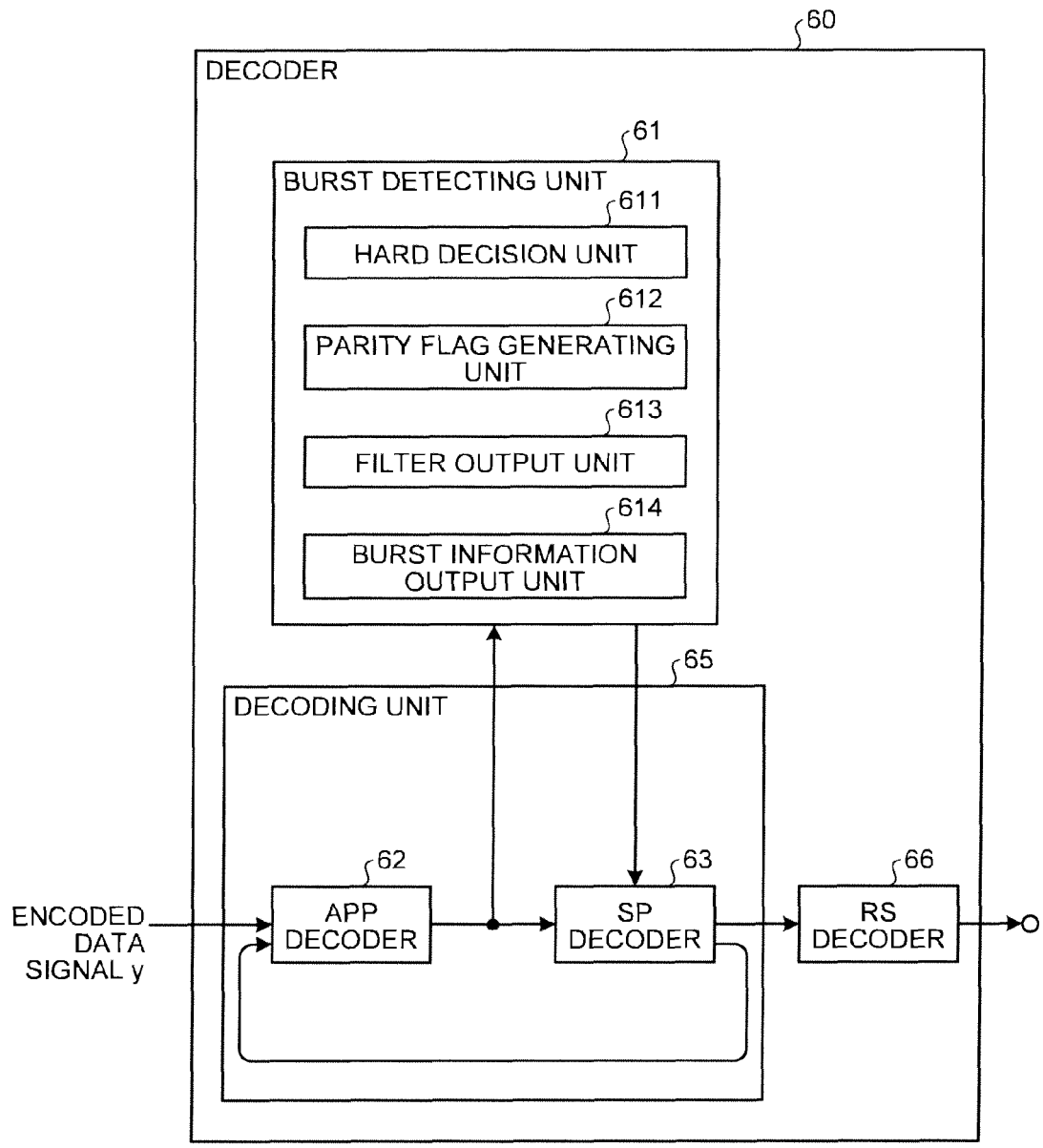
FIG. 1 is a block diagram showing one example of configuration of a decoder 60 to which the present invention is applied.

Configuration of a decoder according to an embodiment of the present invention will be explained in detail with reference to FIG. 1. FIG. 1 is a block diagram showing one example of configuration of a decoder 60 to which the present invention is applied, and only the parts in configuration that are relevant to the present invention are schematically shown.

As illustrated in FIG. 1, the decoder 60 according to the present embodiment schematically includes a decoding unit 65 that executes a decoding process on an encoded data signal that is encoded with a low density parity check code (hereinafter, "LDPC code") and a burst detecting unit 61 that performs a parity check based on the encoded data signal and outputs burst information by which a burst error interval (for example, the position and length of burst errors) of the encoded data signal is specified, in which the two units are connected to each other.

In FIG. 1, the decoding unit 65 is a unit that executes a decoding process on an encoded data signal that is encoded with a low density parity check code. Specifically, the decoding unit 65 suppresses the rise of a likelihood of each bit of the encoded data signal corresponding to the burst error interval (for example, the position and length of burst errors) to perform an iterative decoding process based on the burst information output from the burst detecting unit 61.

In this case, a "likelihood" is a reliability for each bit. For example, a "likelihood" is a log likelihood ratio $L(x)=\log\{P(x=1|y)/P(x=1|y)\}$ that is obtained by dividing a probability $P(x=1|y)$ in which data becomes "1" by a probability $P(x=0|y)$ in which data becomes "0" and expressing the result as a logarithm. In other words, a likelihood is a reliability indicating which of "0" and "1" has a high possibility during recording for each bit of a regeneration signal consisting of "0" and "1". As the reliability of "0" is high, a log likelihood ratio approaches the negative maximum value ($-\infty$). As the reliability of "1" is high, a log likelihood ratio approaches the positive maximum value ($+\infty$). Moreover, when it cannot be determined whether the value of data is "0" or not "1", a log likelihood ratio becomes zero.

As illustrated in FIG. 1, the decoding unit 65 may specifically include an APP decoder 62 that performs a posteriori probability (APP) decoding process on an encoded data signal and outputs a decoded result including a likelihood and an SP decoder 63 that suppresses the rise of the likelihood output from the APP decoder 62 based on the burst information output from the burst detecting unit 61, performs an iterative decoding process on the decoded result output from the APP decoder 62, and outputs a decoded result including the updated likelihood as the input of the APP decoder 62. Moreover, when the present configuration is employed, the SP decoder 63 may suppress the rise of the likelihood output from the APP decoder 62 by using weighting based on the burst information.

In FIG. 1, the burst detecting unit 61 is a unit that performs an LDPC parity check based on the encoded data signal output from the decoding unit 65 (specifically, the APP decoder 62) and outputs burst information by which the burst error interval of the encoded data signal is specified to the decoding unit 65 (specifically, the SP decoder 63). For example, the burst detecting unit 61 performs a parity check on the encoded data signal for each row of a parity check matrix, adds up the number of bits "1" of a row detected as an error in the parity check for each column of the parity check matrix corresponding to each bit of the encoded data signal, specifies a burst error interval of the encoded data signal in accordance with the distribution of the added-up number, and generates and outputs burst information.

As illustrated in FIG. 1, the burst detecting unit 61 specifically includes a hard decision unit 611 that performs a hard decision on the decoded result output from the APP decoder 62, a parity flag generating unit 612 that performs a parity check on the decoded result hard-decided by the hard decision unit 611 based on the parity check matrix and generates a parity flag, a filter output unit 613 that applies the parity flag generated from the parity flag generating unit 612 to a moving average filter and outputs a filter output, and a burst information output unit 614 that performs a threshold decision on the filter output of the filter output unit 613 to specify the position and length of burst errors and outputs burst information to the SP decoder 63. In this case, the filter output unit 613 may apply the parity flag to the moving average filters through multiple stages. As illustrated in FIG. 1, the decoder 60 may further include an RS decoder 66 that performs RS-code decoding on the output of the decoding unit 65. They are the configuration of the decoder 60 according to the present embodiment.

[Decoding Process]

Figure 2:
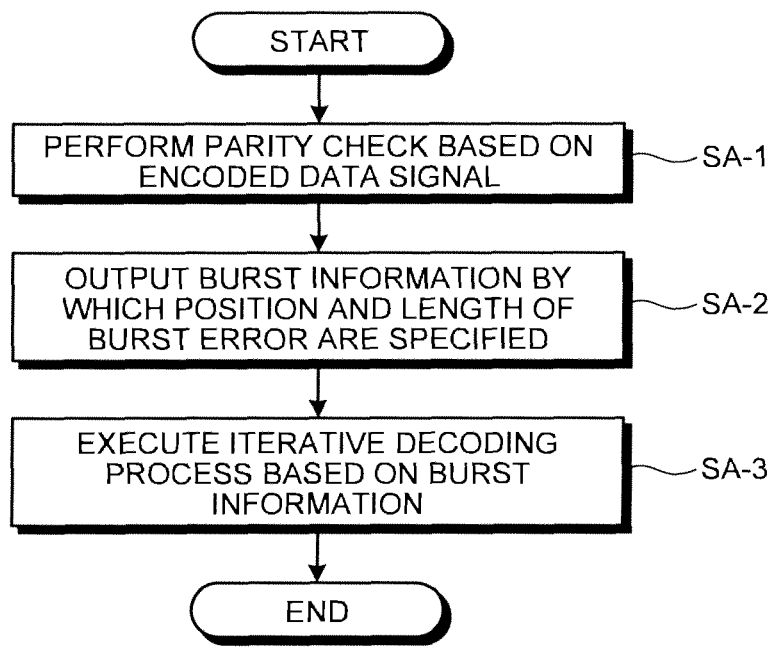
FIG. 2 is a flowchart illustrating an example of the fundamental process of the decoder 60.
Figure 3:
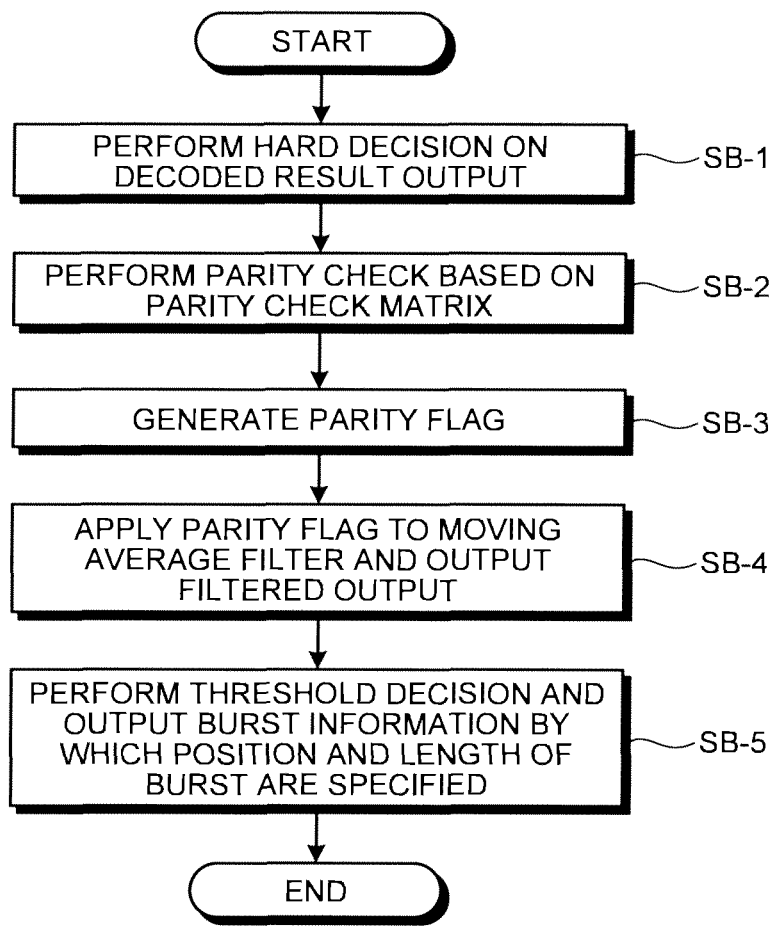
FIG. 3 is a flowchart illustrating an example of a burst detection process that is performed by the burst detecting unit 61.

Next, it will be below explained in detail about an example of a fundamental process that is performed by the decoder 60 having the above configuration with reference to FIGS. 2 and 3. FIG. 2 is a flowchart illustrating an example of the fundamental process of the decoder 60. FIG. 3 is a flowchart illustrating an example of a burst detection process that is performed by the burst detecting unit 61.

As illustrated in FIG. 2, in accordance with the process of the burst detecting unit 61, the decoder 60 performs a parity check based on an encoded data signal that is encoded with an LDPC code (Step SA-1).

Then, in accordance with the process of the burst detecting unit 61, the decoder 60 outputs burst information by which a burst error interval (for example, the position and length of burst errors) of the encoded data signal is specified (Step SA-2).

Then, in accordance with the process of the decoding unit 65, the decoder 60 executes an iterative decoding process while suppressing the rise of a likelihood of each bit of the encoded data signal corresponding to the burst error interval based on the output burst information (Step SA-3).

The above is an example of the fundamental process of the decoder 60. In this case, the burst detecting unit 61 may perform the burst detection process of FIG. 3 at Steps SA-1 and SA-2.

As illustrated in FIG. 3, in accordance with the process of the hard decision unit 611, the burst detecting unit 61 first performs a hard decision on a decoded result (APP output sequence) output from the APP decoder 62 by using zero as a threshold value (Step SB-1).

Then, in accordance with the process of the parity flag generating unit 612, the burst detecting unit 61 performs a parity check on a hard decision result of the APP output sequence for each row based on an LDPC code check matrix (Step SB-2).

Then, in accordance with the process of the parity flag generating unit 612, the burst detecting unit 61 generates a parity flag from the parity check result (Step SB-3). Specifically, the burst detecting unit 61 adds up the number of bits "1" of a row detected as an error in the parity check for each column of the parity check matrix and generates the added-up value as a parity flag.

Then, in accordance with the process of the filter output unit 613, the burst detecting unit 61 shapes the generated parity flag by applying the parity flag to a moving average filter and outputs a filter output (Step SB-4). In this case, the filter output unit 613 may use the moving average filters through multiple stages (for example, two stages in which the first stage is the filter length $L_{MA1}$ and the second stage is the filter length $L_{MA2}$ ($L_{MA2}>L_{MA1}$)). Moreover, when the length of burst errors specified by the burst detecting unit 61 is not less than a predetermined value, the filter output unit 613 may use a moving average filter that outputs a moving average over an interval longer than that of the applied moving average filter and again output a filter output to the burst detecting unit 61. For example, when the length (burst length: $BL_{max}$) of burst errors specified by the burst detecting unit 61 is less than 120, a first two-stage moving average filter ($L_{MA1}=15$, $L_{MA2}=30$) may be applied. When $BL_{max}$ is not less than 120 and is less than 300, a second two-stage moving average filter ($L_{MA1}=50$, $L_{MA2}=100$) may be applied. When $BL_{max}$ is not less than 300, a third moving average filter ($L_{MA1}=100$, $L_{MA2}=200$) may be applied.

Then, in accordance with the process of the burst information output unit 614, the burst detecting unit 61 performs a threshold decision on the filter output, creates burst information by which the position and length of burst are specified, and outputs the burst information to the SP decoder 63 (Step SB-5).

In this way, the SP decoder 63 receives the burst information from the burst detecting unit 61, and repeats an SP decoding process by a predetermined number of times in consideration of the burst information. For example, the SP decoder 63 executes an iterative decoding process while suppressing the rise of a likelihood of each bit corresponding to the position and length of burst errors based on the burst information. In this case, the SP decoder 63 may suppress the rise of a likelihood by using weighting. Moreover, the burst detecting unit 61 described above may detect a burst from the output of the APP decoder 62 only the first time and output burst information to the SP decoder 63. The SP decoder 63 may effectively treat the burst information even in the following iterative decoding process.

Furthermore, the SP decoder 63 returns the decoded result to the APP decoder 62, and performs a control in such a manner that the iterative decoding process is executed by a predetermined number of times between the SP decoder 63 and the APP decoder 62. Finally, the decoder 60 performs a hard decision on a log likelihood ratio output from the SP decoder 63 and obtains an output data sequence. According to this, the explanation of the process of the decoder 60 according to the present embodiment is finished.

First Embodiment

Hereinafter, it will be explained about an embodiment of applying a decoder according to the present embodiment to a perpendicular magnetic recording and reproducing device.

Embodiment 1-1

In the embodiment, a new burst detection method of using an LDPC code check matrix has been proposed. In the first embodiment, there is studied a new burst detection for detecting bit-flipping-like burst that cannot be detected by a conventional burst detector that uses a regeneration waveform, the output of a equalizer, or the output of an APP decoder. Moreover, in a perpendicular magnetic recording and reproducing system having such a burst, performance comparison between an LDPC coding and iterative decoding system with the burst detector proposed in the present embodiment 1-1 and an RS encoding scheme having a conventional erasure error correction is performed by computer simulation. As a result, it became clear that a good characteristic is obtained as compared to a conventional RS encoding scheme and about 1500-bit bit-flipping-like burst can be permitted by performing iterative decoding by using the burst detector proposed in the present application.

Along with high image quality by high vision in addition to the spread of a moving image content such as a digital video, an information amount handled by a user is recently getting larger and larger. In accordance with the explosive increase of an amount of information, the high capacity of a hard disk drive (HDD) is further desired. As an error correction code for realizing the high capacity of HDD, the introduction of a low density parity check (LDPC) code ([1] R. G. Gallager, "Low-density parity-check codes", IRE Trans. Inform. Theory, vol. IT-8, pp. 21 to 28, January 1962) is actively studied. It has been known that an LDPC code is combined with iterative decoding of using a sum-product (SP) algorithm ([2] R. R. Kschischang, B. J. Frey, and H. A. Loeliger, "Factor graphs and the sum-product algorithm," IEEE Trans. Inform. Theory, vol. 47, no. 2, pp. 498 to 519, February 2001) to obtain decoding characteristics that are extremely close to Shannon limit ([3] D. J. C. MacKay and R. M. Neal, "Near Shannon limit performance of low-density parity-check codes," Electron. Lett., vol. 32, pp. 1645 to 1646, August 1996. [4] S. Y. Chung, G. D. Formey, Jr., T. J. Richardson, and R. Urbanke, "On the design of low-density parity-check codes within 0.0045 dB of the Shannon limit," IEEE Commun. Lett., vol. 5, no. 2, pp. 58 to 60, February 2001).

An LDPC code has a problem in that performance degradation caused by burst-like signal degradation such as a medium defect and a thermal asperity (TA) of HDD is large as compared to decoding performance for random errors ([5] Tadashi Wadayama, "Iterative decoding scheme suitable for burst error channel, IEICE(D-II), vol. J88-D-II, no. 2, pp. 170 to 187, February 2005). However, because the occurrence of a medium defect or TA can be detect, the present inventors use burst information detected from the output of an APP decoder by using a vibrational amplitude to configure an LDPC coding and iterative decoding system resistant to burst-like signal degradation ([6] Yasuaki Nakamura, Shin Nakashita, Yoshihiro Okamoto, Hisashi Osawa, Hiroaki Muraoka, and Yoshihisa Nakamura, "Performance evaluation of LDPC coding and iterative decoding system using burst information", IEICE(C), vol. J90-C, no. 5, pp. 437 to 446, May 2007, [7] Yasuaki Nakamura, Mitsuhiro Nishimura, Yoshihiro Okamoto, Hisashi Osawa, Hiroaki Muraoka, and Yoshihisa Nakamura, "A study on correction capability of LDPC code in perpendicular magnetic recording and reproducing system with burst", IEICE technical report, MR2007-23, October 2007).

Therefore, the present embodiment proposes a burst detection method for assuming a 4096-byte/sector long sector format that is officially announced as a standard sector size in the next-generation HDD from IDEMA (International Disk Drive, Equipment, and Materials Association) and for using the parity check matrix of an LDPC code for a perpendicular magnetic recording and reproducing system having a bit-flipping-like signal burst that cannot be easily detected from a regeneration waveform or the output of an APP decoder. A relationship between a required SN ratio and a burst length for decoding predetermined data without errors in an LDPC coding and iterative decoding system to which the detection method is applied is obtained by computer simulation to perform performance evaluation.

Figure 4:
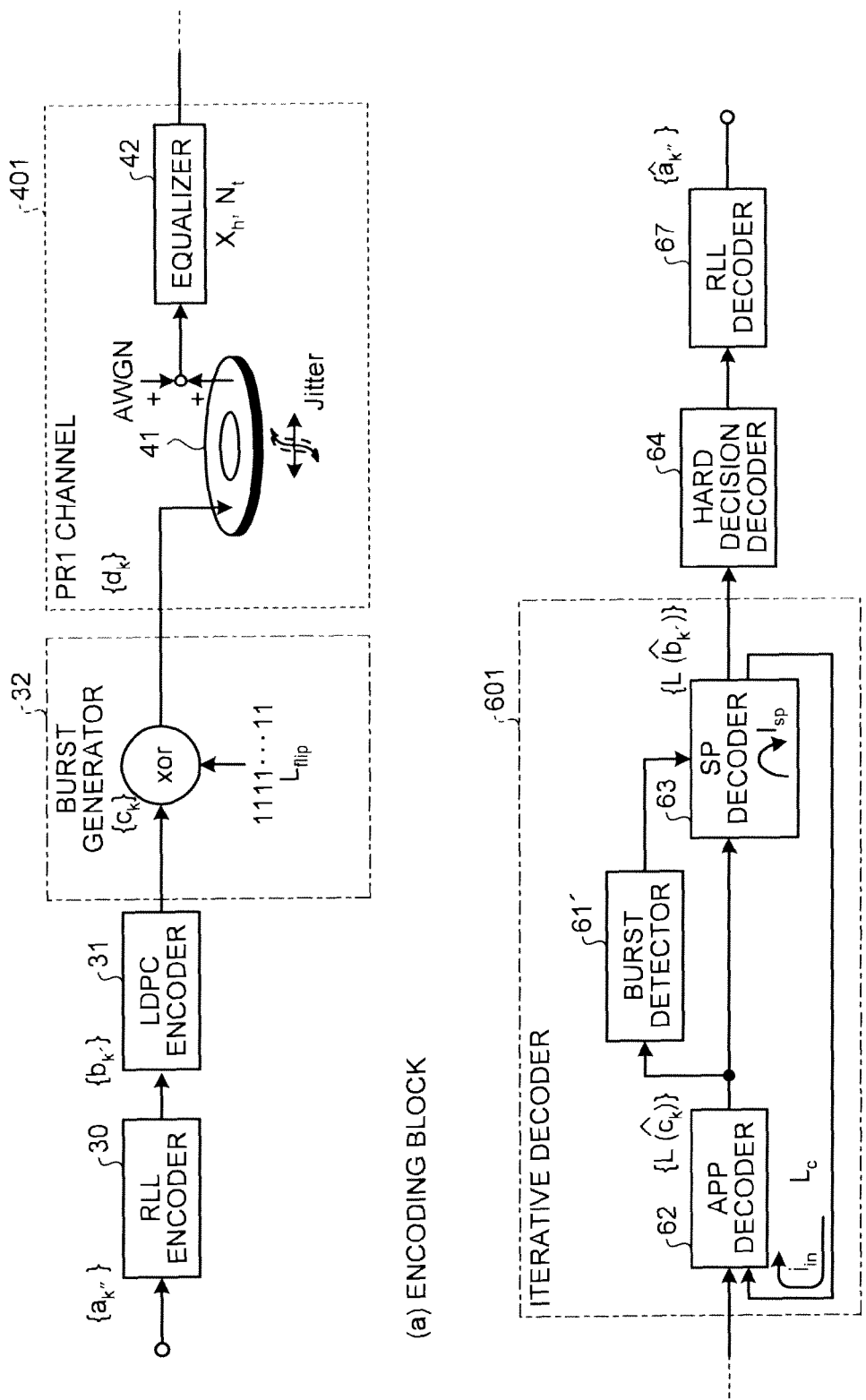
FIG. 4 is a block diagram illustrating an LDPC coding and iterative decoding system with a burst detector that uses a parity check matrix of an LDPC code.

FIG. 4 is a block diagram illustrating an LDPC coding and iterative decoding system with a burst detector that uses a parity check matrix of an LDPC code. Hereinafter, the system is referred to as an "LDPC-PCBD (parity checked burst detection) system". In this case, the upper stage (a) and the lower stage (b) of FIG. 4 respectively illustrate an encoding block and a decoding block. As illustrated in FIG. 4, the encoding block includes an RLL (run-length-limited) encoder 30, an LDPC encoder 31, a burst generator 32, a magnetic recording and reproducing system (PR1 channel 401), and an equalizer 42.

First, an input data sequence $\{a_{k''}\}$ is encoded by the RLL encoder 30 as 128/130(0, 16/8) to be $\{b_{k'}\}$ ([8] Hidetoshi Saito, Toshihiko Iga, Masahiro Shirakawa, Yoshihiro Okamoto, and Hisashi Osawa, "Construction of High Efficient Run Length Limited Codes and Its Performance Evaluation", IEICE(C), vol. J86-C, no. 8, pp. 952 to 961, May 2003). In this case, the present embodiment assumes a 4096-byte/sector long sector format.

Next, $\{b_{k'}\}$ is encoded by the LDPC encoder 31 in an LDPC coding scheme in a sector unit to be $\{c_k\}$. In the first embodiment, because an LDPC code is formed with an encoding rate corresponding to the encoding rate $\eta=0.849$ of an RS code by which 24-byte error correction ([9] T. Morita, Y. Sato, and T. Sugawara, "ECC-Less LDPC coding for magnetic recording channels", IEEE Trans. Magn., vol. 38, no. 5, pp. 2304 to 2306, September 2002) using a Galois field of $GF(2^{10})$ that is used in a current 512-byte/sector HDD can be performed, a row degree and a column degree are respectively defined as 22 and 3. Moreover, a bit-flipping-like signal burst is assumed as errors that cannot be detected from a regeneration waveform or the like. In the computer simulation, this is realized by flipping $\{c_k\}$ over a length $L_{flip}$ that is standardized by a user bit interval $T_b$.

Then, a recording sequence $\{d_k\}$ including a bit-flipping-like error is recorded only once every sector in a perpendicular magnetic recording medium in an NRZ recording method. In the present embodiment, a waveform of the following Equation (1) is assumed as an isolated regeneration waveform for a step-shaped recording waveform ([10] Yoshihiro Okamoto, Mitsuteru Sato, Hidetoshi Saito, Hisashi Osawa, Hiroaki Muraoka, and Yoshihisa Nakamura, "A study on 3/4 MTR coded PRML systems in perpendicular recording system using Double Layered Medium", IEICE technical report, MR2000-8, June 2000).

$$h(t) = A\tanh\left(\frac{\ln 3}{T_{50}}t\right) \qquad (1)$$

In this case, "A" indicates a saturated level of h(t) and "$T_{50}$" indicates a time required for the change of h(t) from $-A/2$ to $A/2$. Moreover, a normalized linear density is defined as the following Equation (2).

$$K = T_{50}/T_b \qquad (2)$$

A jitter-like media noise occurred by the change of a magnetic transition point to white Gaussian and an additive white Gaussian noise (AWGN) of which the average value is zero as a system noise are assumed as a noise at a reading point, and an SN ratio at the reading point is defined as the following Equation (3).

$$SNR = 20\log_{10}\frac{A}{\sqrt{\sigma_J^2 + \sigma_W^2}} \text{ [dB]} \qquad (3)$$

In this case, $\sigma^2_J$ and $\sigma^2_W$ respectively indicate jitter-like media noise power and AWGN power in a band up to $0.6 f_b$ and $f_b=1/T_b$ is a user bit rate. Therefore, the SN ratio of the Equation (3) does not include a burst. Next, a ratio of jitter-like media noise power to total noise power at the reading point is defined as the following equation (4).

$$R_J = \frac{\sigma_J^2}{\sigma_J^2 + \sigma_W^2} \times 100 \quad [\%] \qquad (4)$$

Moreover, the equalizer 42 includes a six-dimensional Butterworth low pass filter having a normalized cutoff frequency $x_h$ that is standardized by $f_b$ and a transversal filter of the number of taps $N_t$. The characteristic of the equalizer 42 is defined in such a manner that a range from a recording head to the output of the equalizer has a PR1 characteristic ([11] E. R. Kretzmer, "Generalization of a technique for binary data communication", IEEE Trans. Commun. Technol., vol. COM-14, pp. 67 to 68, February 1966).

On the other hand, the decoding block (b) that functions as a decoder includes the APP decoder 62 ([12] Y. Nakamura, Y. Okamoto, H. Osawa, H. Saito, H. Muraoka, and Y. Nakamura, "A study of turbo decoding with embedded AR channel model for perpendicular recording", IEEE Trans. Magn., vol. 39, no. 5, pp. 2570 to 2572, September 2003) that uses an AR (autoregressive) channel model as a decoder input estimator, the SP decoder 63, a burst detector 61' that functions as a burst detecting unit, a hard decision decoder 64, and an RLL decoder 67.

In an iterative decoder 601 that functions as a decoding unit for performing an iterative decoding process, the APP decoder 62 first performs decoding on internal coding to obtain a log likelihood ratio (LLR) $\{L(\hat{c}_k)\}$ ("^" is originally designated on the next alphabet). In an AR channel model, a range $L_c$ that considers the correlation of a decoder input noise is defined as five ([12] Y. Nakamura, Y. Okamoto, H. Osawa, H. Saito, H. Muraoka, and Y. Nakamura, "A study of turbo decoding with embedded AR channel model for perpendicular recording", IEEE Trans. Magn., vol. 39, no. 5, pp. 2570 to 2572, September 2003). Then, $\{L(\hat{c}_k)\}$ is input into the SP decoder 63 and the burst detector 61'.

The burst detector 61' detects the position and length of burst from $\{L(\hat{c}_k)\}$ and supplies the result to the SP decoder 63 as burst information by using the parity check matrix of an LDPC code.

The SP decoder 63 repeats an SP decoding that considers burst information by a predetermined number of times. Furthermore, the SP decoder 63 returns the output to the APP decoder 62 to perform iterative decoding. In this case, the repeat count of the SP decoder 63 is $i_{sp}$ and the repeat count returned from the SP decoder 63 to the APP decoder 62 is $i_{in}$. In the present embodiment, the repeat counts of $i_{sp}$ and $i_{in}$ are together five. Moreover, a row operation performed by the APP decoder 62 and the SP decoder 63 uses a MAX-Log-MAP algorithm ([13] P. Robertson, E. Villebrun, and P. Hoeher, "A comparison of optimal and sub-optimal MAP decoding algorithms operating in the long domain", Proc. ICC '95, pp. 1009 to 1013, June 1995).

Then, an output data sequence $\{L(\hat{a}_{k''})\}$ is obtained by performing hard decision and RLL decoding on $\{L(\hat{b}_{k'})\}$. In the present embodiment 1-1, a bit error rate (BER) characteristic is obtained and the performance evaluation of an LDPC coding and iterative decoding system is performed by comparing an input data sequence and an output data sequence.

Figure 5:
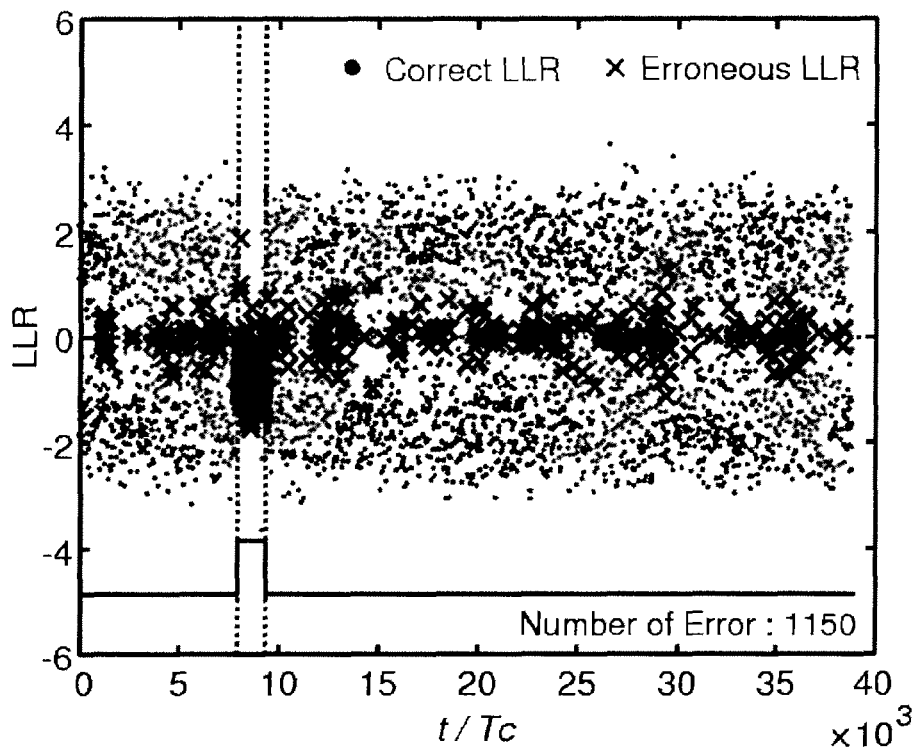
FIG. 5 is a diagram showing the one-sector output of the APP decoder when the burst-like signal degradation of a defect length $L_{defect}=1000$ standardized by $T_b$ due to a medium defect is caused.
Figure 6:
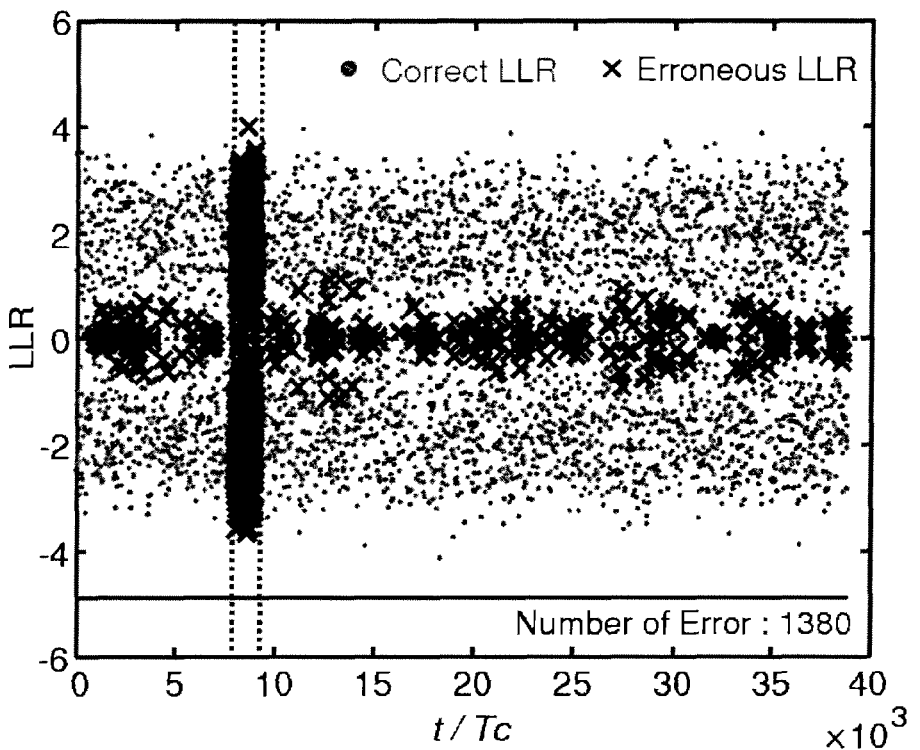
FIG. 6 is a diagram showing the one-sector output of the APP decoder when a burst-like error occurs due to the bit flipping of $L_{flip}=1000$.

FIGS. 5 and 6 are diagrams illustrating the one-sector output of the APP decoder. In this case, it is assumed that K=1.5, $R_J$=80%, SNR=21.5 dB, $x_h$=0.4, $N_t$=15, and $L_c$=5.

FIG. 5 illustrates the output of the APP decoder when the burst-like signal degradation of a defect length $L_{defect}$=1000 standardized by $T_b$ due to a medium defect is caused and FIG. 6 illustrates the output of the APP decoder when a burst-like error occurs due to the bit flipping of $L_{flip}$=1000. In this case, the horizontal axes of FIGS. 5 and 6 indicate a time standardized by a channel bit interval Tc in a recording and reproducing channel. In both diagrams, burst is generated over the same interval from the position of t/Tc=8*10³. Moreover, ● (black circle) and x (multiple mark) marks illustrated in the diagrams respectively indicate rightly-decoded LLR and wrongly-decoded LLR. The drawings illustrate the number (number of errors) of LLRs that are wrongly decoded. As a result, it turns out that the number of LLRs that are wrongly decoded does not have a large difference even if the types of burst are different.

As illustrated in FIG. 5, when burst-like signal degradation caused by a medium defect occurs, a reliability that is the output of the APP decoder in the interval significantly goes low. Therefore, the conventional burst detector can perform a threshold decision on this to detect the position and length of burst ([7] Yasuaki Nakamura, Mitsuhiro Nishimura, Yoshihiro Okamoto, Hisashi Osawa, Hiroaki Muraoka, and Yoshihisa Nakamura, "A study of correction capability of LDPC code in perpendicular magnetic recording and reproducing system with burst", IEICE technical report, MR2007-23, October 2007). Therefore, the LLRs of FIGS. 5 and 6 are input into the conventional detector and burst detection is performed. The detected burst flag is indicated with a solid line in the diagrams. In the case of burst-like signal degradation caused by a medium defect, it turns out from FIG. 5 that LLRs that are the output of the APP decoder are remarkably decreased at the occurrence spot of the medium defect and the position of burst can be generally detected by the threshold decision. However, when the bit-flipping-like signal burst of FIG. 6 occurs, it turns out that the output of the APP decoder is not decreased at the occurrence spot of burst and thus burst is not detected by the threshold decision of the output of the APP decoder. Moreover, as illustrated in FIG. 6, even in the interval in which the bit-flipping-like signal burst occurs, the value of LLR has a level equal to that of LLR located at the position at which burst is not present. Therefore, it is expected that an effect by the expected iterative decoding cannot be obtained due to the influence of incorrect LLR if good burst detection cannot be performed.

Figure 7:
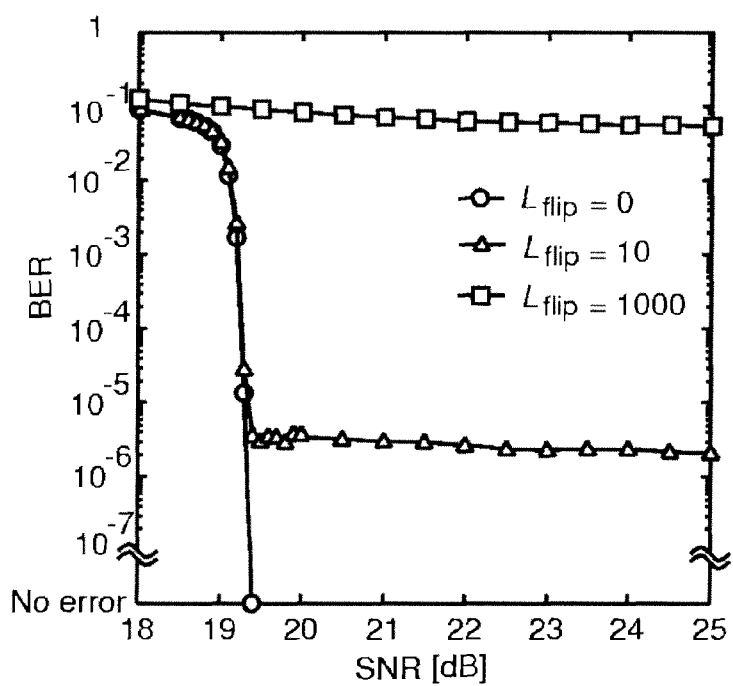
FIG. 7 is a diagram illustrating the error rate characteristics of the LDPC-PCBD system when the burst detector is not activated.

FIG. 7 is a diagram illustrating the error rate characteristics of the LDPC-PCBD system when the burst detector is not activated. In this case, it is assumed that K=1.5, $R_J$=80%, $x_h$=0.4, $N_t$ is an optimum value $N_{topt}$ at which an error rate becomes the minimum, $L_c$=5, $i_{sp}$=5, and $i_{in}$=5. In FIG. 7, ○ (white circle), Δ (white triangle), and □ (white square) marks respectively indicate characteristics in the case of $L_{flip}$=0, 10, and 1000. In this case, $L_{flip}$=0 indicates that a bit-flipping-like signal burst does not occur. According to FIG. 7, in the case of $L_{flip}$=0, there are not errors at SNR=19.4 dB by performing iterative decoding. On the other hand, in the case of $L_{flip}$=10, it can be confirmed that there is an error floor phenomenon in which an error rate is not improved even at a high SN ratio. Moreover, in the case of $L_{flip}$=1000, an error rate is not absolutely improved even at a high SN ratio.

As illustrated in FIG. 6, because the value of LLR is equal to that of the rightly-decoded LLR even in a spot where a bit-flipping-like signal burst occurs, it is considered that good iterative decoding cannot be realized even when it is short like $L_{flip}$=10 and thus this causes the result of FIG. 7. Therefore, even in the case of burst that cannot be detected by the threshold decision of the output of the APP decoder, it is necessary to detect the position and length of burst in order to maintain good decoding characteristics.

Figure 8:
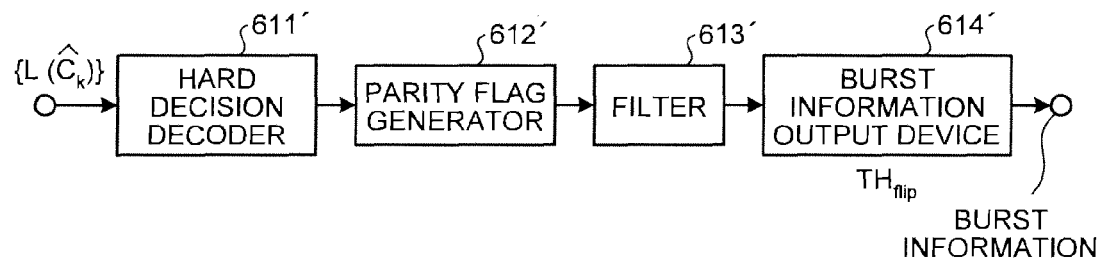
FIG. 8 is a block diagram of the burst detector 61' proposed in the present embodiment.
Figure 9:
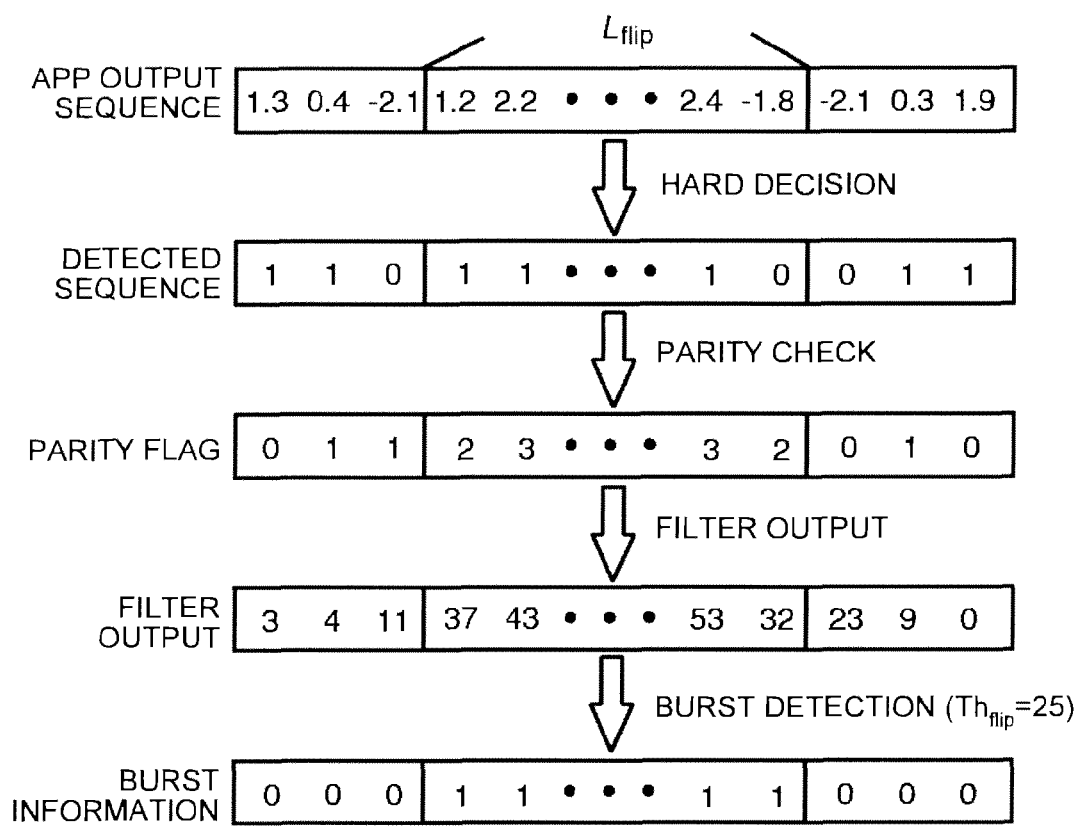
FIG. 9 is a diagram illustrating the flow of burst detection.

In the present embodiment, there is proposed a burst detector that uses the parity check matrix of an LDPC code with respect to burst that cannot be detected by the conventional burst detector. FIGS. 8 and 9 respectively are a block diagram of the burst detector 61' proposed in the present embodiment and a diagram illustrating the flow of burst detection. In this case, it is assumed that a signal burst occurs in a spot indicated by $L_{flip}$ of FIG. 9. The burst detector 61' proposed in the present embodiment includes a hard decision decoder 611' that functions as a hard decision unit, a parity flag generator 612' that functions as a parity flag generating unit, a filter 613' that functions as a filter output unit, and a burst information output device 614' that functions as a burst information output unit.

As illustrated in FIG. 9, the hard decision decoder 611' performs a hard decision on the output sequence $\{L(^\frown c_k)\}$ of the APP decoder by using zero as a threshold value.

The parity flag generator 612' performs a parity check on the hard decision result of $\{L(^\frown c_k)\}$ for each row based on the LDPC code check matrix.

Furthermore, the parity flag generator 612' creates a parity flag from the parity check result. Specifically, the parity flag generator 612' adds up the number of bits "1" of a row detected as an error in the parity check for each column of the parity check matrix and creates the result as a parity flag. Therefore, a parity flag of an LDPC code having a column degree 3 becomes "0" to "3" as illustrated in FIG. 9.

The filter 613' shapes the parity flag through filtering. The filter obtains a sum or a moving average in a predetermined interval and enlarges the value of the position of signal burst to facilitate burst detection as illustrated in FIG. 9.

Figure 10:
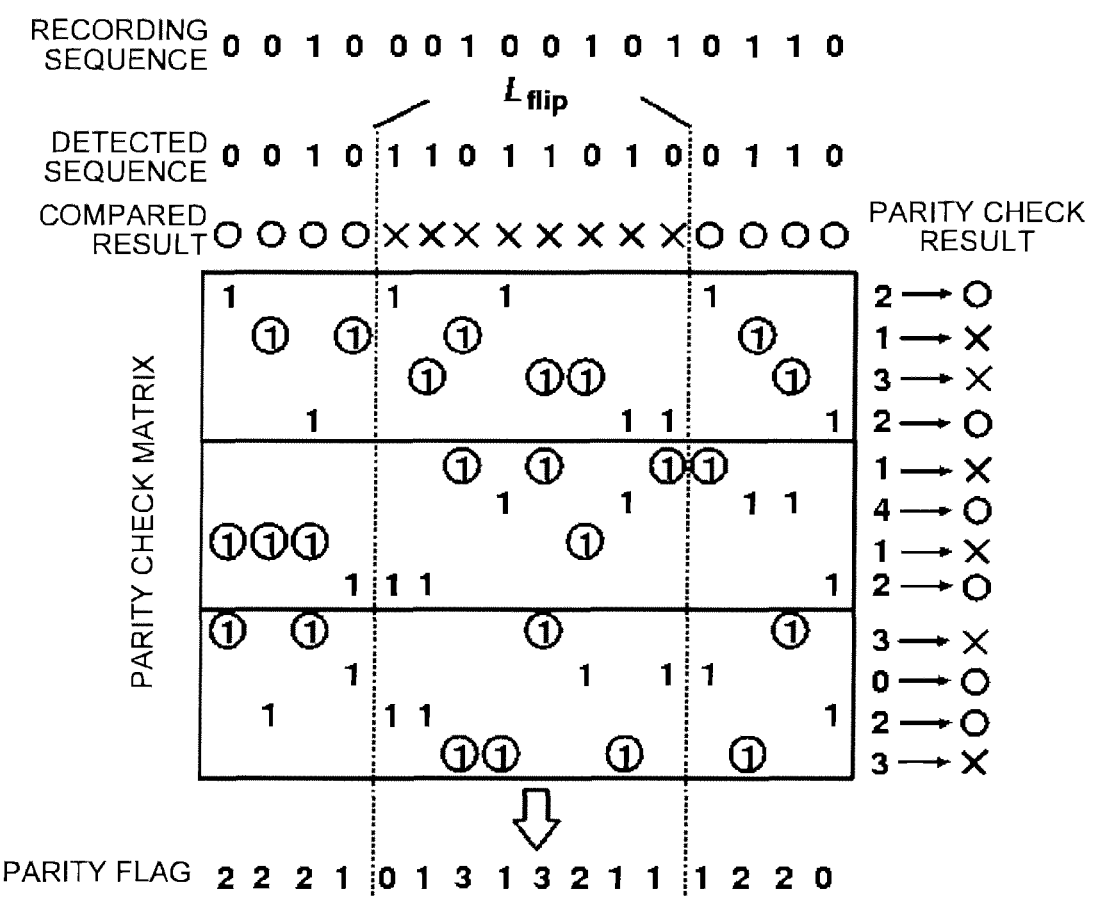
FIG. 10 is a diagram illustrating an example of a parity check.

Finally, the burst information output device 614' determines the filter output in accordance with a threshold decision and outputs burst information of which the values of the burst detection part are "1". FIG. 10 is a diagram illustrating an example of a parity check. An LDPC code that is used in the example indicates a check matrix of which the code length is 16, the row degree is 4, and the column degree is 3. In this case, each submatrix of the LDPC code is surrounded by a solid line and blank portions indicate "0". Moreover, burst errors occur in an interval marked "$L_{flip}$". In other words, the bit values of a recording sequence of the $L_{flip}$ interval are flipped to be the bit values of a detected sequence, and bit-flipping-like burst errors are intentionally generated.

As illustrated in FIG. 10, the parity flag generator 612' performs a parity check on the hard decision result (detected sequence) of the output of the APP decoder for each row, and generates a parity flag. In other words, the parity flag generator 612' checks whether the values of the detected sequence corresponding to "1" in the first row of the parity check matrix are "1" and counts up the values of the parity check matrix of which the values are "1" (the counted-up value is "2" at the first row). Because an even parity is defined as normal in the present embodiment, the parity result of the first row is recorded as normal (○ in the diagram). Then, the parity flag generator 612' performs this process on all rows (the 1st to 12th row) of the parity check matrix, and checks (attaches ○ mark to "1") "1" of a row determined as anomaly (x mark in the diagram) in the parity check result as illustrated in FIG. 10. Then, the parity flag generator 612' adds up the number of the checked "1" ("1" of ○ mark) of the same column of the parity check matrix and raises a parity flag. As illustrated in FIG. 10, because a parity flag becomes "3" when errors are detected in the same column of all submatrices in the case of an LDPC code having a column degree 3, a parity flag is distributed with the values of "0" to "3".

Figure 11:
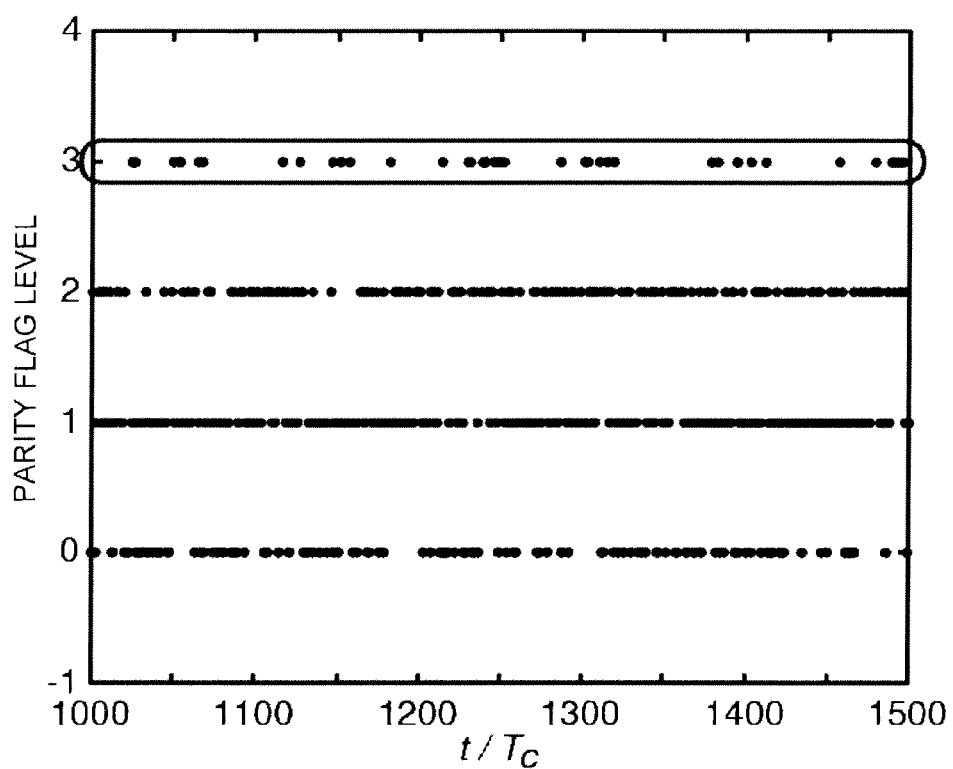
FIG. 11 is a diagram showing parity flag detected when a signal burst does not occur.
Figure 12:
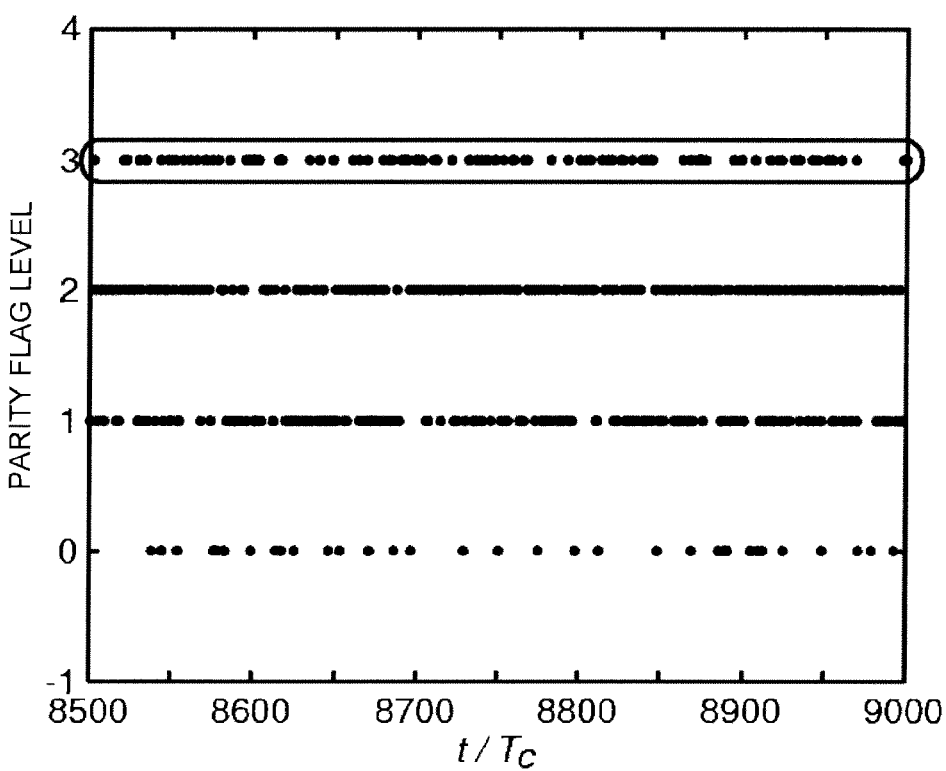
FIG. 12 is a diagram showing parity flag detected when a signal burst occurs.

FIGS. 11 and 12 are diagrams illustrating a parity flag that is actually detected. In this case, parameters used in computer simulation are the same as those of FIGS. 5 and 6. In FIGS. 11 and 12, a bit-flipping-like signal burst of $L_{flip}=1000$ is generated from the position of t/Tc=8000. In other words, FIG. 11 emphatically illustrates a part in which a signal burst does not occur and FIG. 12 emphatically illustrates a part in which a signal burst occurs. It turns out from the diagrams that occurrence frequency of a parity flag of a level 3 (the maximum value in an LDPC code having a column degree 3) in an interval in which a signal burst occurs is high compared to an interval in which burst does not occur. Therefore, good burst detection can be expected by filtering the result of the parity check. In other words, an interval in which the value of a parity flag is continuously high can be estimated as a candidate for a burst error interval. A moving average filter having weighting when a parity flag level is "3" is applied to the present embodiment. In this case, the filter 613' has a two-stage configuration of taking a moving average over antero-posterior 100 channel bits and again taking a moving average over anteroposterior 200 channel bits.

Figure 13:
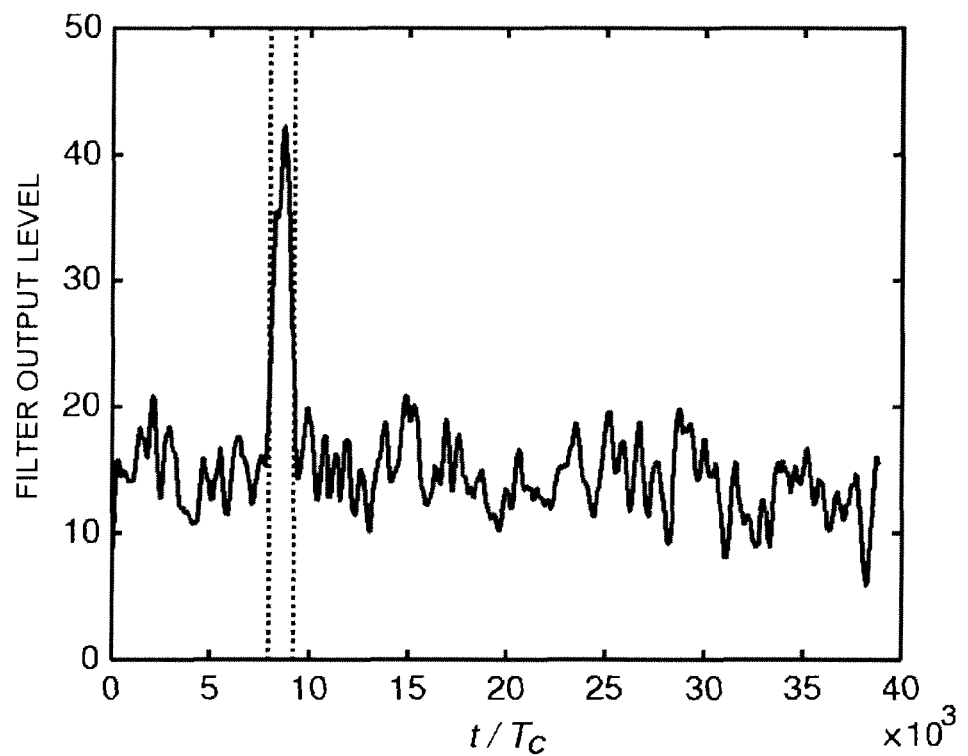
FIG. 13 is a diagram illustrating a filter output per one sector.

FIG. 13 is a diagram illustrating a filter output per one sector. In this case, parameters used in computer simulation are the same as those of FIGS. 5 and 6. A dotted line of FIG. 13 indicates an interval in which a bit-flipping-like signal burst occurs. It can be confirmed from FIG. 13 that the level of the filter output in the interval is high. Therefore, it can be expected that burst detection can be performed by a threshold decision.

Figure 14:
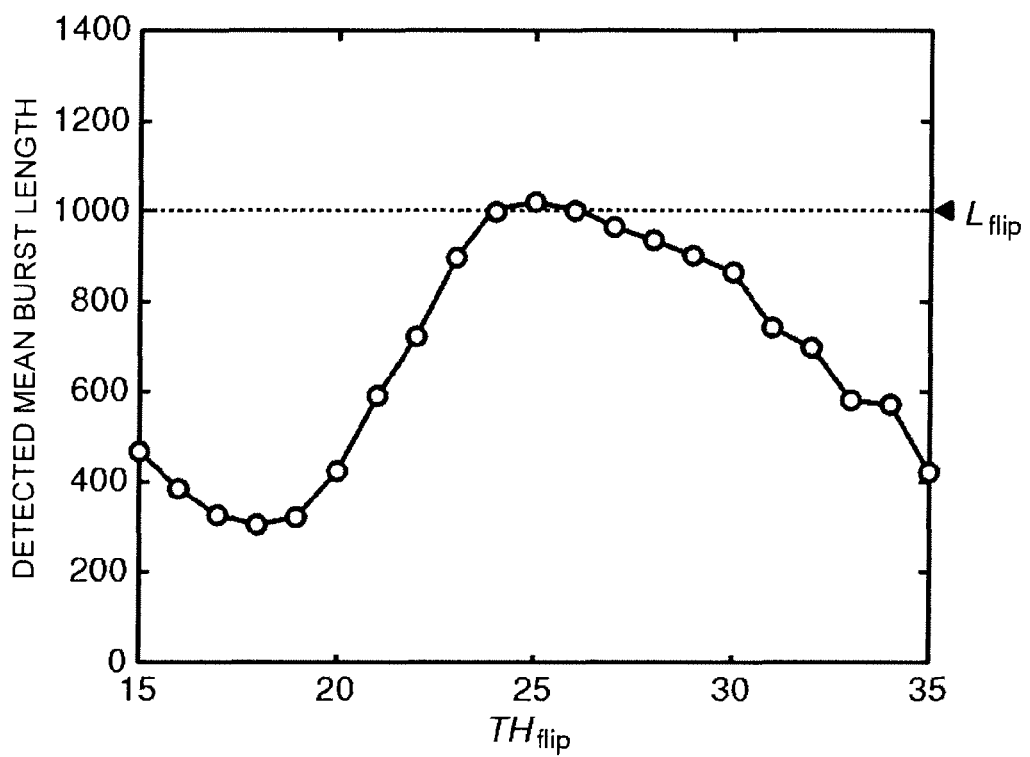
FIG. 14 is a diagram illustrating a relationship between the detected mean burst length and $TH_{flip}$.

FIG. 14 is a diagram illustrating a relationship between the detected mean burst length and $TH_{flip}$. In this case, $TH_{flip}$ is a threshold value of a filter output level for detecting burst generated by bit flipping. Parameters used in computer simulation are the same as those of FIGS. 5 and 6. Moreover, a dotted line of FIG. 14 indicates the generated bit flipping length $L_{flip}=1000$. It turns out from FIG. 14 that the average value of the detected burst lengths is close to the generated $L_{flip}=1000$ between 24 to 26 of $TH_{flip}$.

Figure 15:
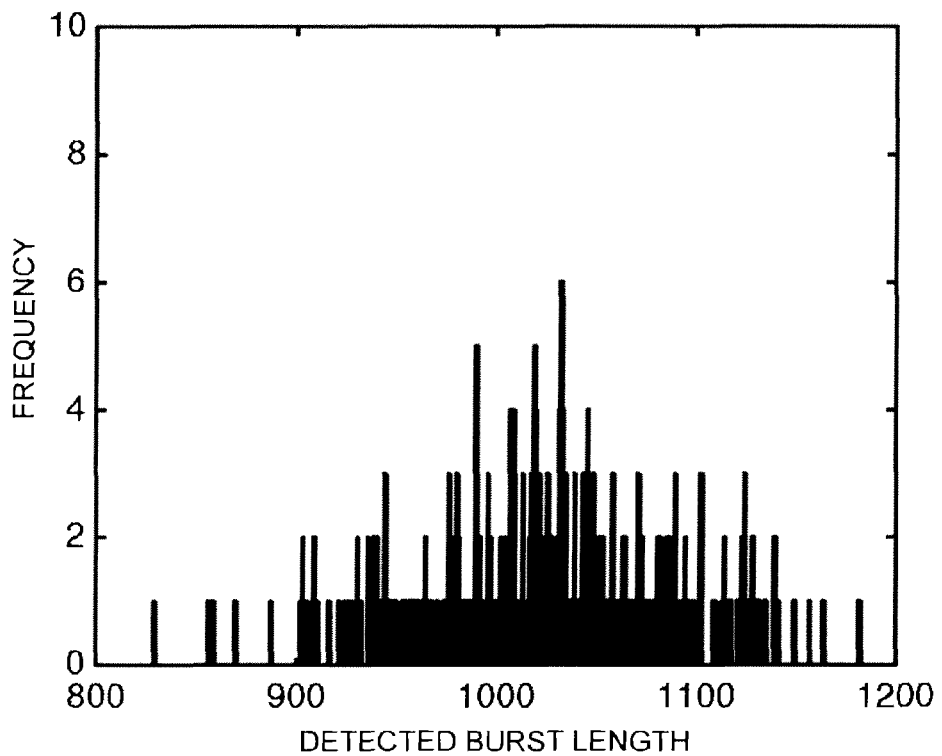
FIG. 15 is a diagram illustrating the frequency distribution of the detected burst lengths.

FIG. 15 is a diagram illustrating the frequency distribution of the detected burst lengths. In this case, parameters used in computer simulation are the same as those of FIGS. 5 and 6 except $TH_{flip}=25$. It turns out from FIG. 15 that a burst length close to the generated bit flipping length $L_{flip}=1000$ can be generally detected and thus appropriate burst detection can be performed when $TH_{flip}$ is 25. Therefore, it is assumed that the threshold value $TH_{flip}$ for detecting burst is 25 that is an average value in the following study of the present embodiment.

However, the value of incorrect LLR decoded at the position of burst is considerably large as illustrated in FIG. 6, and thus iterative decoding may not be realized as illustrated in $L_{flip}=0$ of FIG. 7 if the detected burst length is short. Therefore, in the present embodiment, a burst error interval is defined by extending both ends of the detected burst flag by 100 bits and burst information is output.

The SP decoder 63 attenuates the value of LLR corresponding to the burst error interval based on the burst information and performs iterative decoding until it reaches the set repeat count $i_{sp}$, in order to suppress the propagation of errors due to burst. Moreover, the burst information is detected with respect to the output of the APP decoder only the first time, and is also efficient even in the following iterative decoding. The present inventors show that the propagation of errors due to a burst part can be suppressed by controlling the value of LLR inside the SP decoder 63 and performing iterative decoding of suppressing the rise of LLR ([7] Yasuaki Nakamura, Mitsuhiro Nishimura, Yoshihiro Okamoto, Hisashi Osawa, Hiroaki Muraoka, and Yoshihisa Nakamura, "A study of correction capability of LDPC code in perpendicular magnetic recording and reproducing system with burst", IEICE technical report, MR2007-23, October 2007). Even the present embodiment, the excessive rise of LLR is suppressed by multiplying a weighting factor $W_{La}$ during an iterative process in the SP decoder 63.

Figure 16:
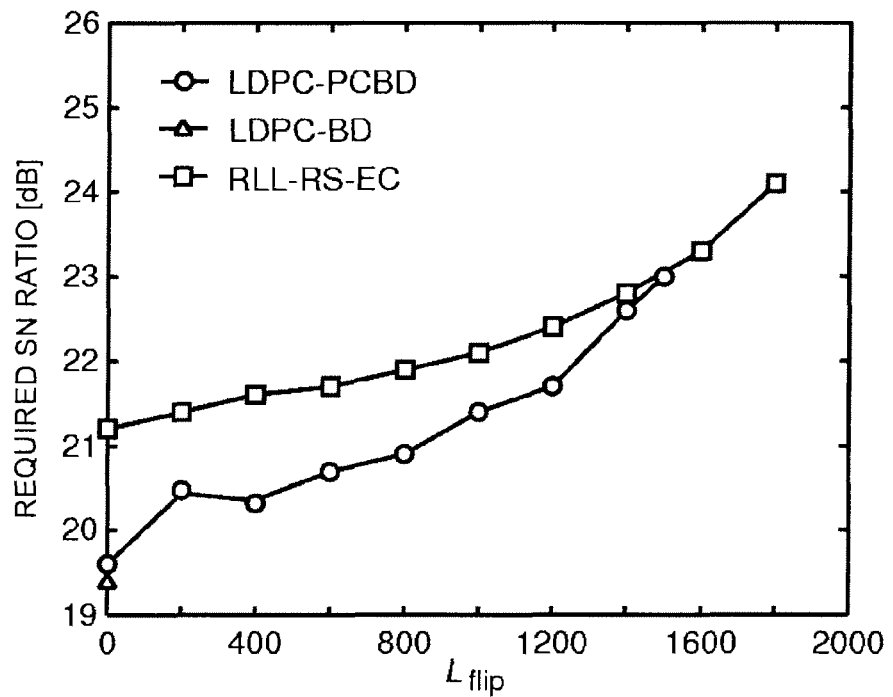
FIG. 16 is a diagram illustrating a relationship between a required SN ratio and $L_{flip}$ for decoding predetermined data without errors.

FIG. 16 is a diagram illustrating a relationship between a required SN ratio and $L_{flip}$ for decoding predetermined data without errors. In this case, it is assumed that K=1.5, $R_j$=80%, $x_h$=0.4, $N_t$=$N_{topt}$, $L_c$=5, $i_{sp}$=5, $i_{in}$=5, and the total number of user data is 10M bits. As described above, ○ (white circle), Δ (white triangle), and □ (white square) marks illustrated in the diagram respectively indicate the characteristics of an LDPC-PCBD system that includes a burst detector proposed in the present embodiment, an LDPC-BD system that includes a conventional burst detector that detects amplitude fluctuation, and an RLL-RS-EC system that adds an RS code for detecting burst errors to perform erasure error correction ([7] Yasuaki Nakamura, Mitsuhiro Nishimura, Yoshihiro Okamoto, Hisashi Osawa, Hiroaki Muraoka, and Yoshihisa Nakamura, "A study of correction capability of LDPC code in perpendicular magnetic recording and reproducing system with burst", IEICE technical report, MR2007-23, October 2007). In this case, it is assumed that a threshold value for burst detection in the LDPC-PCBD system is $TH_{flip}$=25 and a weighting factor multiplied by LLR inside the SP decoder 63 is $W_{La}$=0.7 (idem). Moreover, it is assumed that an RS code in the RLL-RS-EC system is a 190-byte error correctable code (idem) that uses a Galois field of $GF(2^{12})$.

It turns out from FIG. 16 that the LDPC-BD system is not absolutely resistant to a bit-flipping-like signal burst. As illustrated in FIG. 7, it is considered that this reason is that an error floor phenomenon occurs even when extremely short burst like $L_{flip}$=10 occurs. On the other hand, it turns out that the LDPC-PCBD system permits a bit-flipping-like signal burst up to around $L_{flip}$=1500 and thus has large resistance characteristics to a bit-flipping-like signal burst compared to the LDPC-BD system. Furthermore, it turns out that the clearing of errors can be realized up to the vicinity of $L_{flip}$=1200 with an SN ratio that is lower than that of the RLL-RS-EC system by 0.7 dB or more.

As described above, the present embodiment proposes a new burst detector that uses an LDPC code check matrix. In other words, there is tried the detection of burst that cannot be detected by the conventional burst detector that uses a regeneration waveform, the output of an equalizer, and the output of an APP decoder. Moreover, in the perpendicular magnetic recording with a bit-flipping-like signal burst, performance comparison between the LDPC coding and iterative decoding system (LDPC-PCBD system) that includes the burst detector proposed in the present embodiment, the LDPC coding and iterative decoding system (LDPC-BD system) that includes the conventional burst detector that uses amplitude fluctuation, and the RS coding erasure error correction system (RLL-RS-EC system) is performed by computer simulation. As a result, it became clear that the LDPC coding and iterative decoding system (LDPC-PCBD system) that uses the burst detector proposed in the present embodiment can permit a bit-flipping-like signal burst until the bit flipping length $L_{flip}$ reaches around 1500 and thus has largely-improved resistance characteristics compared to the case where the conventional burst detector is used (LDPC-BD system). Furthermore, it became clear that the LDPC coding and iterative decoding system (LDPC-PCBD system) can permit a bit-flipping-like signal burst up to the burst of around $L_{flip}$=1200 with an SN ratio lower than the RS coding erasure error correction system (RLL-RS-EC system) by about 0.7 dB or more.

Embodiment 1-2

The embodiment 1-1 shows that burst detection of using the parity check matrix of an LDPC code is effectively performed on a bit-flipping-like signal burst that cannot be detected from a regeneration waveform or the output of an APP decoder. However, because burst information is created by using a moving average filter in the burst detection method of using a check matrix, the detection of short burst not more than 200 channel bits has room for improvement. Therefore, the present embodiment 1-2 proposes a system that can also perform decoding on a short signal burst without errors by coupling an RS coding to the LDPC coding and iterative decoding system (LDPC-PCBD system) and applies the system to the perpendicular magnetic recording and reproducing system with a bit-flipping-like signal burst to evaluate its performance.

Figure 17:
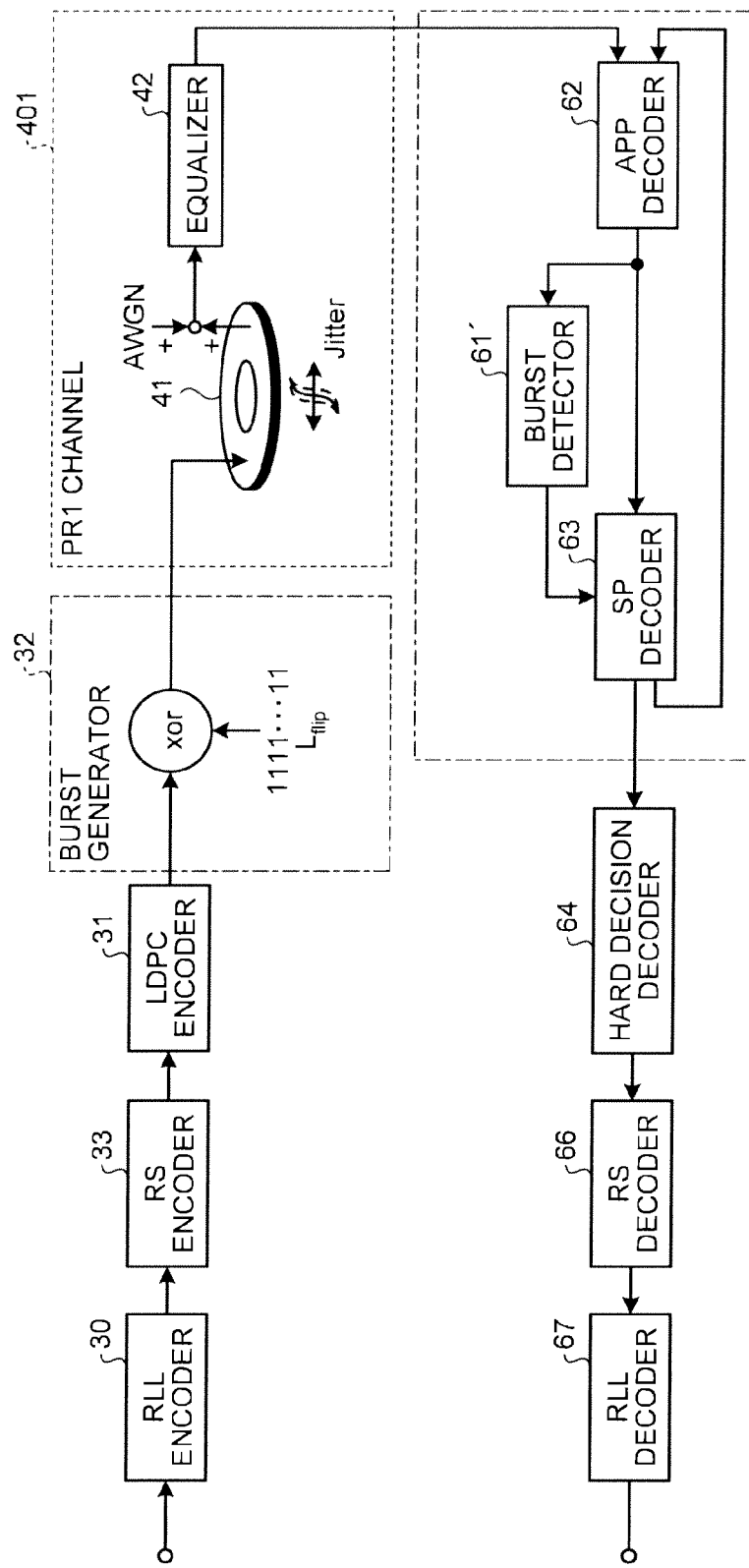
FIG. 17 is a block diagram illustrating a recording and reproducing system that employs the LDPC coding and iterative decoding system to which the RS coding is coupled.

FIG. 17 is a block diagram illustrating a recording and reproducing system that employs the LDPC coding and iterative decoding system to which the RS coding is coupled. The present embodiment assumes a 4096-byte/sector long sector format. It is assumed that an RLL code is 128/130(0, 16/8) RLL code and an RS code is a 20-code-symbol error correctable RS code of using $GF(2^{12})$ that can correct 200 channel bits or more errors. Moreover, a regular LDPC code of which the information length is 33280, the row degree is 24, and the column degree is 3 is used, and the entire encoding rate becomes 0.84. The present embodiment assumes that a bit-flipping-like signal burst having a length $L_{flip}$ standardized by the user bit interval $T_b$ occurs only once every sector (see the embodiment 1-1). Moreover, the present embodiment assumes an isolated regeneration waveform as a waveform of the Equation (1) and a white Gaussian noise and a jitter-like media noise as a noise at a reading point. Moreover, a normalized linear density standardized by $T_b$ is defined as $T_{50}/T_b$. The SP decoder 63 performs decoding in consideration of the burst information that is obtained by the burst detector 61' that uses the LDPC code check matrix (see the embodiment 1-1).

Figure 18:
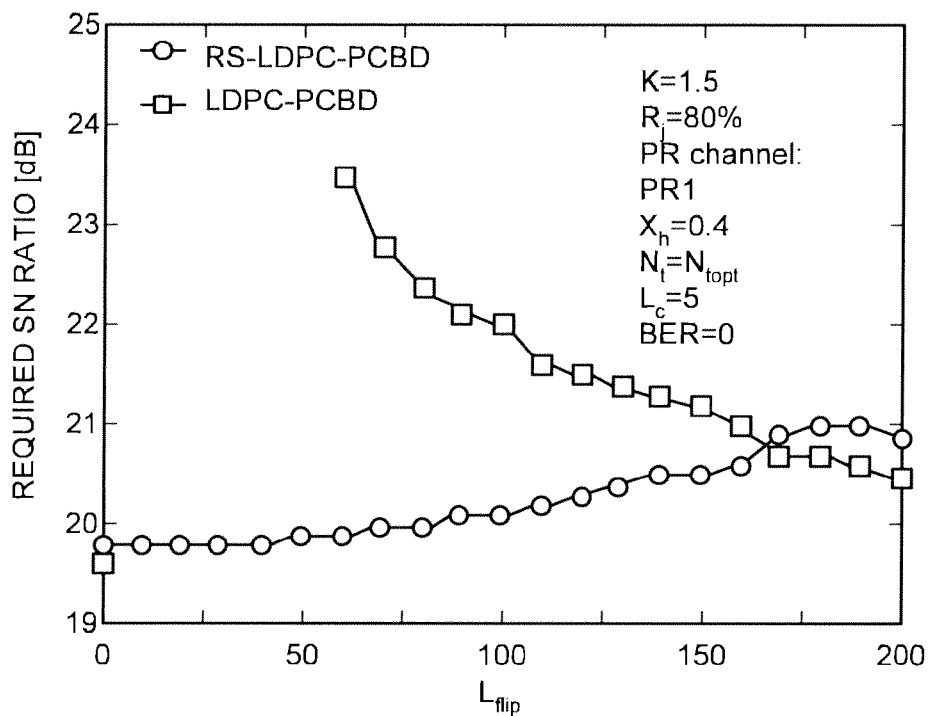
FIG. 18 is a diagram illustrating a relationship between a required SN ratio and a burst length $L_{flip}$ for decoding predetermined data without errors, which is obtained by computer simulation.

FIG. 18 is a diagram illustrating a relationship between a required SN ratio and a burst length $L_{flip}$ for decoding predetermined data without errors, which is obtained by computer simulation. In this case, it is assumed that an input sequence is an M sequence of which the total number of user data is 10M bits, K=1.5 ([2] Okamoto et al., IEICE technical report, MR2000-8, June 2000), a ratio of jitter-like media noise power to total noise power is R=80%, a normalized cutoff frequency of a low pass filter standardized by a bit rate $f_b$ is $x_h$=0.4, the number of taps $N_t$ of a transversal filter is an optimum value $N_{topt}$ at which an error rate becomes the minimum, a PR system is a PR1 system, and the number of channel bits that considers a noise in an AR channel model ([3] A. Kavcic et al., IEEE Trans. Magn., vol. 35, no. 5, pp. 2316 to 2318, September 1999) that is used in the APP decoder 62 is $L_c$=5 ([4] Y. Nakamura, Y. Okamoto, H. Osawa, H. Saito, H. Muraoka, and Y. Nakamura, "A study of turbo decoding with embedded AR channel model for perpendicular recording", IEEE Trans. Magn., vol. 39, no. 5, pp. 2570 to 2572, September 2003). Moreover, a comparison method employs the LDPC coding and iterative decoding system (LDPC-PCBD system) that uses only a regular LDPC code of which the information length is 33280, the row degree is 22, and the column degree is 3 (see the embodiment 1-1). In the diagram, ○ (white circle) and □ (white square) marks respectively indicate the characteristics of the RS-LDPC-PCBD system to which the RS coding proposed in the present embodiment 1-2 is coupled and the LDPC-PCBD system proposed in the embodiment 1-1. It turns out from the diagram that the RS-LDPC-PCBD system does not have errors with respect to a short signal burst of $L_{flip}$=10 to $L_{flip}$=50 in which the LDPC-PCBD system has errors and further has good characteristics in $L_{flip}$≤160 compared to the LDPC-PCBD system.

As described above, the embodiment 1-2 proposes the LDPC coding and iterative decoding system (RS-LDPC-PCBD system) to which an RS coding is coupled with respect to a perpendicular magnetic recording and reproducing system with bit-flipping-like burst and performs performance evaluation. As a result, it became clear that correction capability for a short signal burst is improved by coupling an RS code to an LDPC code.

Embodiment 1-3

The present inventors construct an LDPC coding and iterative decoding system resistant to burst-like signal degradation ([1] R. Berger et al., IEEE Trans. Magn., vol. 38, no. 5, pp. 2435 to 2437, September 2002) such as a medium defect that occurs in a hard disk drive by using burst information detected from the output of an APP decoder by amplitude fluctuation ([2] Nakamura et al., IEICE technical report, MR2007-23, October 2007). Moreover, the embodiment 1-1 shows that burst detection of using the parity check matrix of an LDPC code is effectively performed on a bit-flipping-like signal burst that cannot be detected from a regeneration waveform or the output of an APP decoder. When a medium defect and a bit-flipping-like signal burst occur at the same time, only performing burst detection from a regeneration waveform or the like by using amplitude fluctuation cannot respond to a bit-flipping-like signal burst. According to the present embodiment 1-3, in the perpendicular magnetic recording and reproducing system with burst-like signal degradation caused by a medium defect, performance evaluation is performed on an LDPC coding and iterative decoding system that includes a burst detector that uses an LDPC code check matrix.

Because the configuration (LDPC-PCBD system) of the present embodiment 1-3 is similar to that of FIG. 4 according to the embodiment 1-1, their descriptions are omitted. The present embodiment assumes a 4096-byte/sector long sector format. The present embodiment assumes an isolated regeneration waveform as a waveform of Equation (1) and a white Gaussian noise and a jitter-like media noise as a noise at a reading point. Moreover, the present embodiment assumes a medium defect as burst-like signal degradation and assumes that a medium defect of a defect length $L_{defect}$ standardized by the bit interval $T_b$ occurs only once every sector. The SP decoder 63 performs decoding in consideration of the burst information that is obtained by the burst detector 61' that uses the LDPC code check matrix. In the present embodiment 1-3, weighting is performed on LLR inside the SP decoder 63 ([2] Nakamura et al., IEICE technical report, MR2007-23, October 2007). Then, performance evaluation is performed by obtaining a relationship between a required SN ratio and a defect length for decoding predetermined data without errors by computer simulation.

Figure 19:
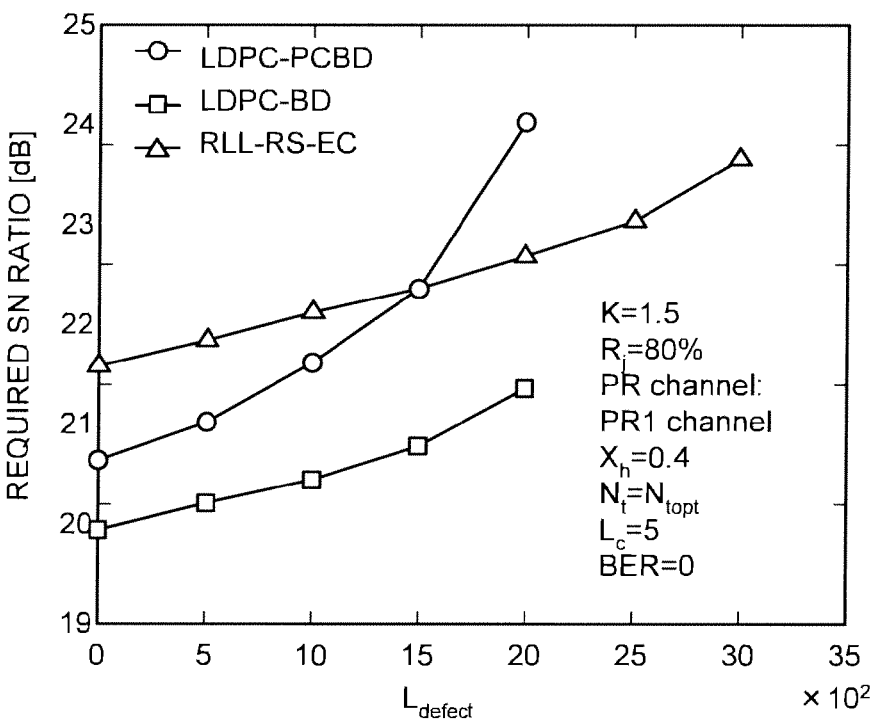
FIG. 19 is a diagram illustrating a relationship between a required SN ratio and a defect length for decoding predetermined data without errors.

FIG. 19 is a diagram illustrating a relationship between a required SN ratio and a defect length for decoding predetermined data without errors. In this case, it is assumed that an input sequence is an M sequence of which the total number of user data is 10M bits, a normalized linear density is K=1.5 ([4] Okamoto et al., IEICE technical report, MR2000-8, June 2000), a ratio of jitter-like media noise power to total noise power is $R_j$=80%, a normalized cutoff frequency of a low pass filter is $x_h$=0.4, the number of taps $N_t$ of a transversal filter is an optimum value $N_{topt}$ at which an error rate becomes the minimum, a PR system is a PR1 system, the number of channel bits that considers a noise in an AR channel model is $L_c$=5, and an LDPC code is a regular LDPC code of which the information length is 33280, the row degree is 22, and the column degree is 3 ([2] Nakamura et al., IEICE technical report, MR2007-23, October 2007). It is assumed that repeat counts $i_{sp}$ and $i_d$, in the SP decoder 63 and the iterative decoder 601 are together five and a weighting factor $W_{La}$ multiplied by LLR in the SP decoder 63 is 0.7 (idem). In the drawing, ○ (white circle), □ (white square), and Δ (white triangle) marks respectively show the characteristics of the LDPC-PCBD system, the LDPC-BD system (idem) that performs burst detection from the output of an APP decoder by using a vibrational amplitude, and the RLL-RS-EC system that adds an RS coding for detecting burst errors and performs erasure error correction. In this case, an RS code used in the RLL-RS-EC system is a 190-code-symbol error correctable code (idem) of using GF($2^{12}$). It turns out from the diagram that the LDPC-PCBD system can permit burst up to about $L_{defect}$=2000 and can realize the clearing of errors up to the vicinity of $L_{defect}$=1000 with an SN ratio lower than that of the RLL-RS-EC system by 0.5 dB or more although the LDPC-PCBD system has an inferior characteristic compared to the LDPC-BD system.

In this way, according to the present embodiment 1-3, in the perpendicular magnetic recording and reproducing system with burst-like signal degradation caused by a medium defect, performance evaluation is performed on an iterative decoding system (LDPC-PCBD system) that has a burst detector that uses an LDPC code check matrix. As a result, it became clear that the LDPC-PCBD system is effective for burst errors when a medium defect occurs in addition to a bit-flipping-like signal burst that cannot be detected from a regeneration waveform or the like.

Embodiment 1-4

As described in the embodiment 1-1, the burst detector that uses an LDPC code check matrix cannot easily detect comparatively short burst. Therefore, the present embodiment 1-4 studies the improvement of a detection capability for a short bit-flipping-like signal burst and realizes a burst detector resistant to short burst by improving a moving average filter. Moreover, in the perpendicular magnetic recording and reproducing system with a bit-flipping-like signal burst, performance comparison between an LDPC coding and iterative decoding system (improved LDPC-PCBD system) that includes a burst detector proposed in the embodiment 1-4 and an RS coding erasure error correction system (RLL-RS-EC system) is performed by computer simulation. As a result, it became clear that the LDPC coding and iterative decoding system (improved LDPC-PCBD system) that includes a burst detector proposed in the present embodiment 1-4 is also resistant to a short bit-flipping-like signal burst. Moreover, it became clear that the LDPC coding and iterative decoding system (improved LDPC-PCBD system) has a good characteristic with respect to the bit-flipping-like signal burst of about 40 to 1000 bits compared to the RS coding erasure error correction system (RLL-RS-EC system).

In recent years, with the high definition of a home video camera or with the advent of super hi-vision broadcasting that is a next-generation high-definition moving-image format, it is expected that the handling information of a user becomes increasingly large and it is further desired that an information storage device, particularly a hard disk drive (HDD) has a high capacity. The introduction of an LDPC code is actively studied as a next-generation error correction code for realizing the high capacity ([1] R. G. Gallager, "Low-density parity-check codes", IRE Trans. Inform. Theory, vol. IT-8, pp. 21 to 28, January 1962). It has been known that an LDPC code has a high decoding gain by combining with iterative decoding and further has high performance for burst-like signal degradation by specifying burst information by using amplitude fluctuation and by performing iterative decoding by using burst information that includes the position and length of burst ([2] W. Tan and J. R. Cruz, "Array codes for erasure correction in magnetic recording channels", IEEE Trans. Magn., vol. 39, no. 5, pp. 2579 to 2581, September 2003. [3] T. Morita, Y. Sato, and T. Sugawara, "ECC-less LDPC coding for magnetic recording channels", IEEE Trans. Magn., vol. 38, no. 5, pp. 2304 to 2306, September 2002. [4] Yasuaki Nakamura, Shin Nakashita, Yoshihiro Okamoto, Hisashi Osawa, Hiroaki Muraoka, and Yoshihisa Nakamura, "Performance evaluation of LDPC coding and iterative decoding system using burst information", IEICE C, vol. J-90-C, no. 5, pp. 437 to 446, May 2007). Moreover, as described above, it is shown that a bit-flipping-like signal burst, which is caused by the overwriting of an adjacent track according to a pole-erase phenomenon ([5] K. Nakamoto, T. Okada, K. Watanabe, H. Hoshiya, N. Yoshida, Y. Kawato, M. Hatatani, K. Meguro, Y. Okada, H. Kimura, M. Mochizuki, K. Kusukawa, C. Ishikawa, and M. Fuyama, "Single-pole/TMR heads for 140-Gb/in2 perpendicular recording", IEEE Trans. Magn., vol. 40, no. 1, pp. 290 to 294, January 2004) that cannot be detected from a regeneration amplitude, the output of an equalizer, the output of an APP decoder, and the like, can be detected by a burst detector that uses an LDPC code check matrix (the embodiment 1-1). However, it was difficult that the burst detector that uses an LDPC code check matrix proposed in the embodiment 1-1 detects a signal burst shorter than 50 bits depending on the configuration of a moving average (MA) filter ([7] Yasuaki Nakamura, Seigo Sato, Mitsuhiro Nishimura, Yoshihiro Okamoto, Hisashi Osawa, and Hiroaki Muraoka, "A study of error correcting system for perpendicular magnetic recording and reproducing system with bit flipping burst", 2008 IEICE, C-7-14, March 2008).

Therefore, the present embodiment 1-4 assumes a 4096-byte/sector long sector format officially announced as the next-generation sector size of HDD from IDEMA (International Disk Drive, Equipment, and Materials Association) and proposes the configuration of a burst detector that can detect burst even when a short bit-flipping-like signal burst not more than 50 bits occurs. Then, in the LDPC coding and iterative decoding system (improved LDPC-PCBD system) to which the burst detector is applied, a relationship between a required SN ratio and a burst length for decoding predetermined data without errors is obtained by computer simulation and performance evaluation is performed.

Because the schematic configuration of the present embodiment 1-4 is similar to that of the embodiment 1-1, FIG. 4 is referred to as a configuration diagram. As illustrated in FIG. 4, the encoding block includes the RLL encoder 30, the LDPC encoder 31, the magnetic recording and reproducing system, and the equalizer 42. An input data sequence $\{a_{k''}\}$ is encoded by the RLL encoder 30 as 128/130(0, 16/8) to be $\{b_{k'}\}$ ([8] Hidetoshi Saito, Toshihiko Iga, Masahiro Shirakawa, Yoshihiro Okamoto, and Hisashi Osawa, "Construction of High Efficient Run Length Limited Codes and Its Performance Evaluation", IEICE (C), vol. J86-C, no. 8, pp. 952 to 961, May 2003). The $\{b_{k'}\}$ is encoded by the LDPC encoder 31 in a sector unit to be $\{c_k\}$. In the present embodiment, because an LDPC code is constituted with an encoding rate corresponding to the encoding rate $\eta=0.849$ of a 24-code-symbol error correctable ([3] T. Morita, Y. Sato, and T. Sugawara, "ECC-less LDPC coding for magnetic recording channels", IEEE Trans. Magn., vol. 38, no. 5, pp. 2304 to 2306, September 2002) RS code of using a Galois field of $GF(2^{10})$ that is used in a current 512-byte/sector HDD, a regular LDPC code of which the row degree and column degree are respectively 22 and 3 is used. Moreover, the partial overwriting of the other track information that is caused by a pole-erase phenomenon ([5] K. Nakamoto, T. Okada, K. Watanabe, H. Hoshiya, N. Yoshida, Y. Kawato, M. Hatatani, K. Meguro, Y. Okada, H. Kimura, M. Mochizuki, K. Kusukawa, C. Ishikawa, and M. Fuyama, "Single-pole/TMR heads for 140-Gb/in2 perpendicular recording", IEEE Trans. Magn., vol. 40, no. 1, pp. 290 to 294, January 2004) is assumed as a signal burst that cannot be detected from a regeneration waveform or the like. In the computer simulation, a bit-flipping-like signal burst is realized by flipping $\{c_k\}$ over the length $L_{flip}$ standardized by the user bit interval $T_b$ only once every sector by using the burst generator 32. Then, the recording sequence $\{d_k\}$ to which the signal burst is added by the burst generator 32 is recorded in a perpendicular magnetic recording medium 41 in an NRZ recording method.

The present embodiment assumes an isolated regeneration waveform for a step-shaped recording waveform as Equation (1) described in the embodiment 1-1 ([9] Yoshihiro Okamoto, Mitsuteru Sato, Hidetoshi Saito, Hisashi Osawa, Hiroaki Muraoka, and Yoshihisa Nakamura, "A study on 3/4 MTR coded PRML systems in perpendicular recording system using double layered medium", IEICE technical report, MR2000-8, June 2000). Moreover, a normalized linear density standardized by $T_b$ is similarly defined by Equation (2) described above.

A jitter-like media noise caused by the variation of a magnetic transition point to white Gaussian and an additive white Gaussian noise (AWGN) of which the average value is zero as a system noise are assumed as a noise at a reading point, and an SN ratio at the reading point is defined by Equation (3) described above. Moreover, a ratio of jitter-like media noise power to total noise power at the reading point is defined by the Equation (4).

The equalizer 42 includes a six-dimensional Butterworth low pass filter that has a normalized cutoff frequency $x_h$ standardized by $f_b$ and a transversal filter of the number of taps Nt, and performs waveform equalization in such a manner that a range from a recording head to the output of the equalizer has a PR1 characteristic ([10] E. R. Kretzmer, "Generalization of a technique for binary data communication", IEEE Trans. Commun. Technol., vol. COM-14, pp. 67 to 68, February 1966).

On the other hand, the decoding block (b) that functions as a decoder includes the APP decoder 62 ([11] Y. Nakamura, Y. Okamoto, H. Osawa, H. Saito, H. Muraoka, and Y. Nakamura, "A study of turbo decoding with embedded AR channel model for perpendicular recording", IEEE Trans. Magn., vol. 39, no. 5, pp. 2570 to 2572, September 2003) that includes an AR (autoregressive) channel model as an estimator, the SP decoder 63, the burst detector 61' that functions as a burst detecting unit, the hard decision decoder 64, and the RLL decoder 67. First, the APP decoder 62 performs posteriori probability decoding on the PR1 channel 401 and obtains a log likelihood ratio (LLR) sequence $\{L(\hat{c}_k)\}$. In this case, it is assumed that a range that considers the correlation of a decoder input noise is Lc=5 in the AR channel model (idem). Then, the APP decoder 62 inputs $\{L(\hat{c}_k)\}$ into the SP decoder 63 and the burst detector 61'. The burst detector 61' detects the occurrence position and length of burst from $\{L(\hat{c}_k)\}$ by using a parity check matrix according to a code constraints of an LDPC code, and supplies the occurrence position and length to the SP decoder 63 as burst information (see the embodiment 1-1). The SP decoder 63 attenuates the value of LLR based on the burst information and performs iterative decoding until it reaches the set repeat count, in order to suppress the propagation of errors caused by burst. The burst information is detected for the output of the APP decoder only the first time and is also efficient in the following iterative decoding. Moreover, the propagation of errors caused by burst is suppressed by suppressing the excessive rise of LLR by the multiplication of the weighting factor $W_{La}$ in the iterative process performed in the SP decoder 63 ([12] Yasuaki Nakamura, Mitsuhiro Nishimura, Yoshihiro Okamoto, Hisashi Osawa, Hiroaki Muraoka, and Yoshihisa Nakamura, "A study of correction capability of LDPC code in perpendicular magnetic recording and reproducing system with burst", IEICE technical report, MR2007-23, October 2007). In this case, the iterative decoder 601 is configured by returning the output of the SP decoder to the APP decoder 62. Moreover, it is assumed that a repeat count in the SP decoder 63 is $i_{sp}$ and a repeat count returned from the SP decoder 63 to the APP decoder 62 is $i_{in}$. In the present embodiment, the repeat counts $i_{sp}$ and are together five times. When the iterative decoding of a predetermined number of times ends, the output estimate value $\{L(\hat{b}_{k'})\}$ of the LDPC encoder is obtained. Then, an output data sequence $\{\hat{a}_{k''}\}$ is obtained by performing hard decision and RLL decoding on $\{L(\hat{b}_{k'})\}$, and a bit error rate (BER) characteristic is obtained by comparing the output data sequence with the input data sequence.

Because the fundamental configuration of the burst detector 61' is similar to that of the embodiment 1-1, its explanation is made with reference to FIG. 8. In other words, the burst detector 61' includes the hard decision decoder 611', the parity flag generator 612', the filter 613', and the burst information output device 614'.

As illustrated in FIG. 8, the hard decision decoder 611' performs a hard decision on the output sequence $\{L(\hat{c}_k)\}$ of the APP decoder by using zero as a threshold value.

Next, the parity flag generator 612' performs a parity check on the hard decision result of $\{L(\hat{c}_k)\}$ for each row based on the LDPC code check matrix and creates a parity flag from the parity check result.

Then, the filter 613' facilitates burst detection by enlarging the value of the occurrence position of a signal burst by using an MA (Moving Average) filter having a two-stage configuration. The MA filters having a two-stage configuration first obtains a moving average over between anteroposterior $L_{MA1}$ channel bits with respect to the parity flag, and again obtains a moving average over between anteroposterior $L_{MA2}$ channel bits. After that, the first-stage and second-stage MA filters are described as $MA_1$ and $MA_2$. Due to structural problems of the MA filter, burst may be detected shorter than an original burst before and after the occurrence position and the termination position of burst. Therefore, burst information is generated by using a result obtained by extending anteroposterior $L_{MA1}$ channel bits with respect to the detected burst as a burst interval and is outputs to the SP decoder 63.

Because the object of the study of the present inventors in the embodiment 1-1 is the detection of a signal burst in the case of $200 \leq L_{flip}$, an MA filter of $L_{MA1}=100$ and $L_{MA2}=200$ is employed. In the case of $MA_1$, the influence of a frequency band of $1/L_{MA1}=0.005$ times or more of the fundamental frequency of $\{L(\hat{c}_k)\}$, that is, the influence of a parity flag other than the occurrence position of burst can be suppressed. Furthermore, in the case of $MA_2$, the influence of the output of $MA_1$ of $1/L_2=0.00025$ times or more of the fundamental frequency of the output of $MA_1$ can be suppressed. Therefore, in the embodiment 1-1, burst detection is easily performed at the occurrence position of burst in the case of $200 \leq L_{flip}$.

Figure 20:
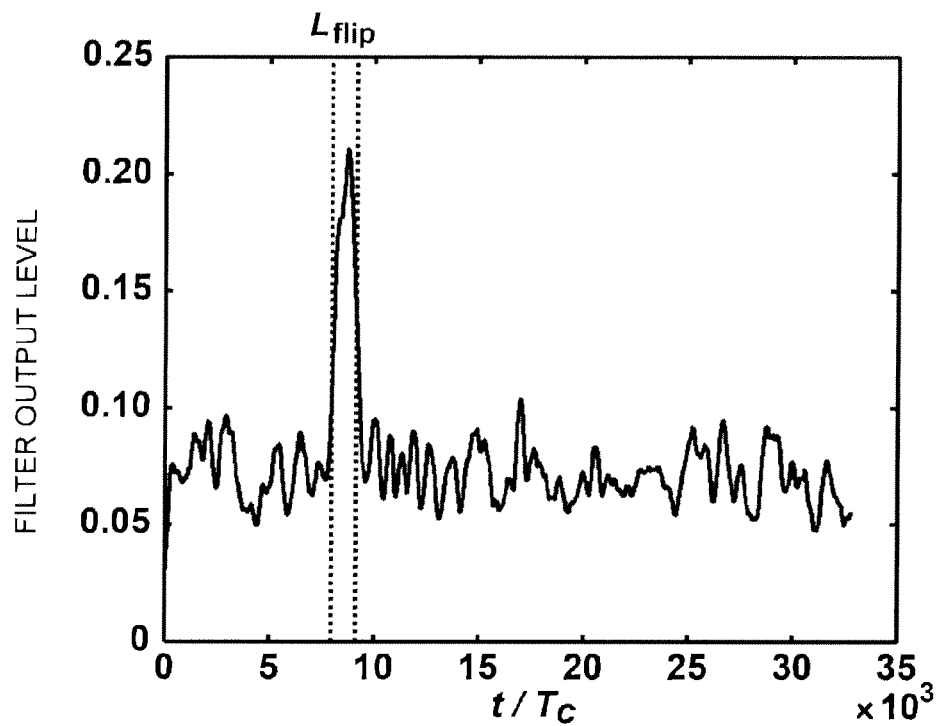
FIG. 20 is a diagram illustrating the output of the MA filter when a signal burst of $L_{flip}=1000$ occurs.

FIG. 20 is a diagram illustrating the output of the MA filter when a signal burst of $L_{flip}=1000$ occurs. In this case, it is assumed that K=1.5, $R_f$=80%, SNR=21.5 dB, $x_h$=0.4, $N_t$=15, $L_c$=5, $L_{MA1}$=100, and $L_{MA2}$=200. Moreover, the case where the burst of $L_{flip}=1000$ occurs from the position of time $t/T_c$=8000 standardized by the channel bit interval $T_c$ is illustrated, and the occurrence position of burst is surrounded with a dotted line. It is expected from the diagram that a filter output level becomes large in the neighborhood of the occurrence position of burst and thus the occurrence position and length of burst can be detected by performing a threshold decision on a filter output as a certain level.

Figure 21:
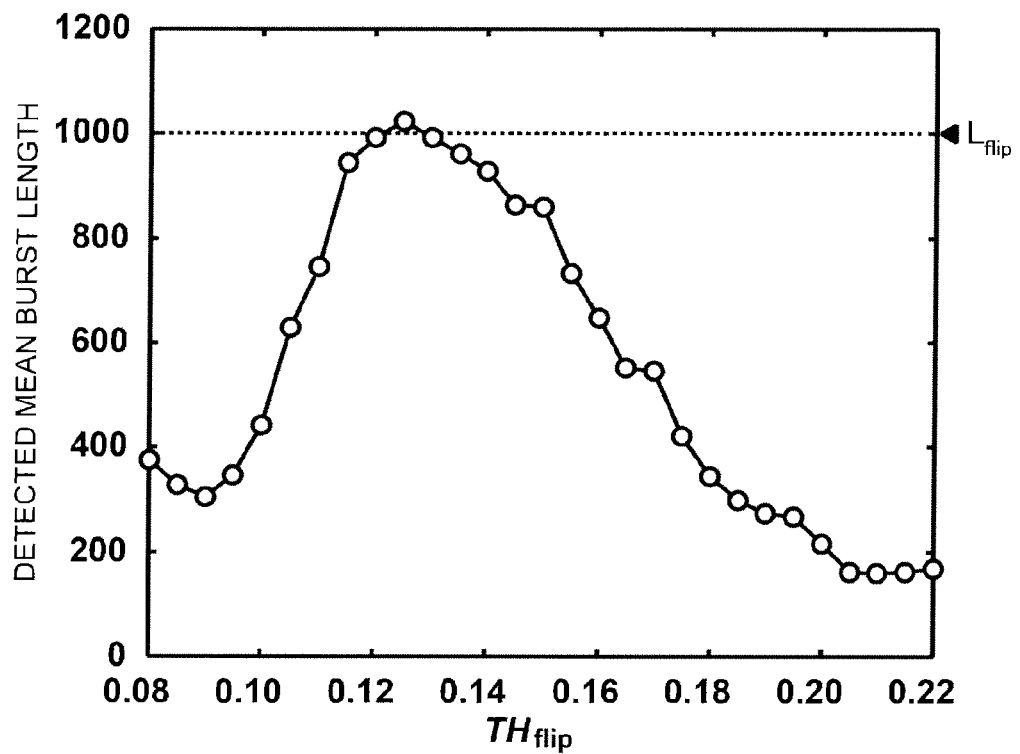
FIG. 21 is a diagram illustrating a relationship between the detected mean burst length and $TH_{flip}$.

FIG. 21 is a diagram illustrating a relationship between the detected mean burst length and $TH_{flip}$. In this case, a simulation condition is the same as that of FIG. 20. A dotted line of the diagram indicates the generated burst length $L_{flip}$. Moreover, $TH_{flip}$ indicates the threshold value of a filter output level for detecting burst. It turns out from FIG. 21 that burst equal to the length of a signal burst that is added near $TH_{flip}$=0.12 can be detected. Therefore, in the subsequent study, burst detection is performed by performing a threshold decision on the output of the MA filter by using $TH_{flip}$=0.12.

Figure 22:
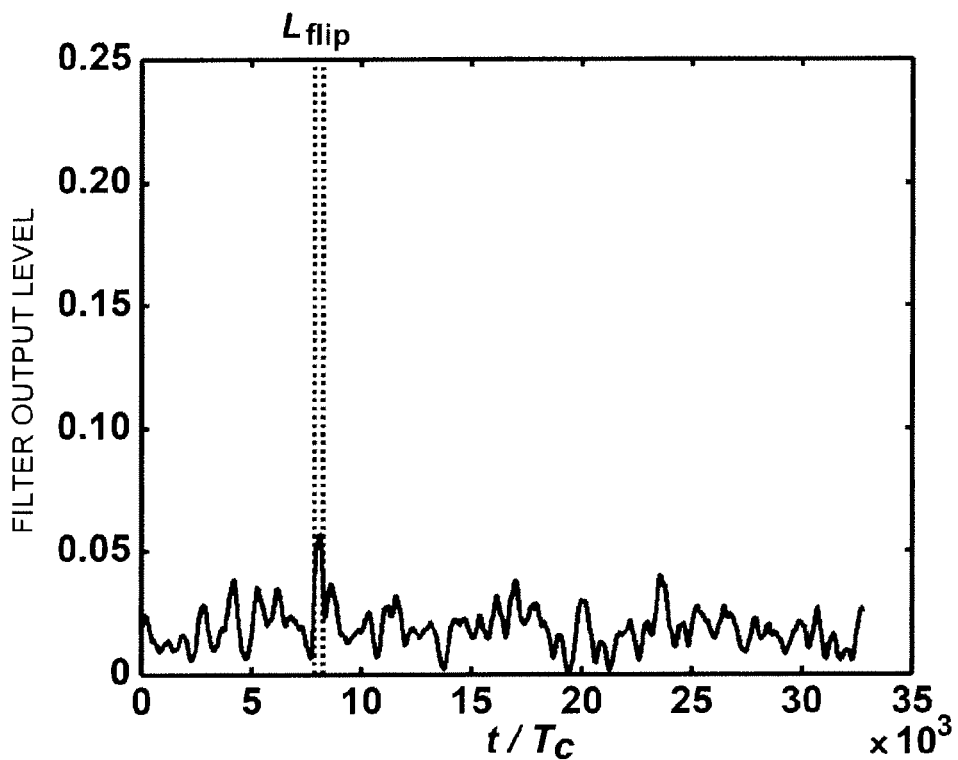
FIG. 22 is a diagram illustrating the output of the MA filter when a signal burst of $L_{flip}=50$ occurs.

FIG. 22 is a diagram illustrating the output of the MA filter when a signal burst of $L_{flip}$=50 occurs. In this case, a simulation condition is the same as that of FIG. 20 except $L_{flip}$. It turns out from the diagram that the position of burst surrounded with a dotted line cannot be absolutely detected assuming that $TH_{flip}$=0.12.

Figure 23:
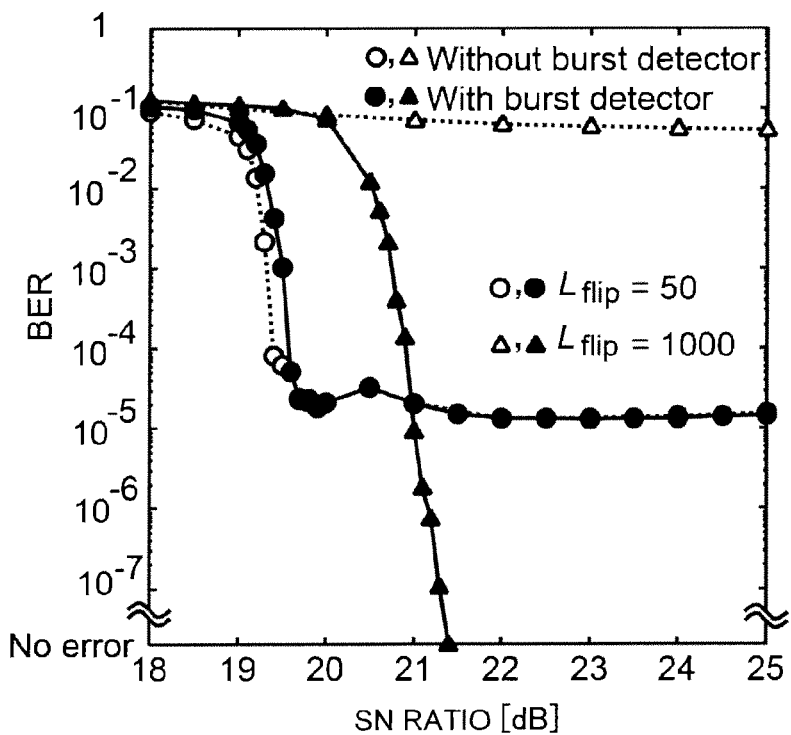
FIG. 23 is a diagram illustrating a BER characteristic in an LDPC-PCBD system that uses a burst detector that includes the MA filters of $L_{MA1}=100$ and $L_{MA2}=200$.

FIG. 23 is a diagram illustrating a BER characteristic in an LDPC-PCBD system that uses a burst detector that includes the MA filters of $L_{MA1}$=100 and $L_{MA2}$=200. In this case, it is assumed that K=1.5, $R_f$=80%, $x_h$=0.4, $N_t$ is an optimum value $N_{topt}$ at which an error rate is the minimum, $L_c$=5, $i_{sp}$=5, $W_{La}$=0.7, $L_{MA1}$=100, $L_{MA2}$=200, and $TH_{flip}$=0.12. In the drawing, circle marks (○, ●) and triangle marks (Δ, ▲) respectively indicate the characteristics in the case of $L_{flip}$=1000 and $L_{flip}$=50. Moreover, white marks (○, Δ) indicate the case where the burst detector is not activated and black marks (●, ▲) indicate the case where the burst detector is activated. It turns out from the diagram that decoding can be performed on the burst of $L_{flip}$=1000 with SNR=21.4 dB without errors by using the burst detector. On the other hand, it turns out that an error floor phenomenon occurs for the burst of $L_{flip}$=50 irrespective of the presence or absence of the operation of the burst detector. As illustrated in FIG. 22, this reason is that iterative decoding that considers burst information cannot be performed because the detection of short burst cannot be performed.

Therefore, in the present embodiment 1-4, it is considered about the configuration of an MA filter that can detect burst even when a signal burst shorter than $L_{flip}$=200 occurs. In consideration of the frequency characteristic of the MA filter, there are used three kinds of two-stage MA filters of filter 1 that corresponds to comparatively short burst of $L_{flip} \leq 100$ that includes MA filters of $L_{MA1}$=15 and $L_{MA2}$=30, filter 2 that corresponds to about middle burst of $100 < L_{flip} \leq 200$ that includes MA filters of $L_{MA1}$=50 and $L_{MA2}$=100, and filter 3 that corresponds to long burst of $200<L_{flip}$ that includes MA filter of $L_{MA1}=100$ and $L_{MA2}=200$.

Figure 24:
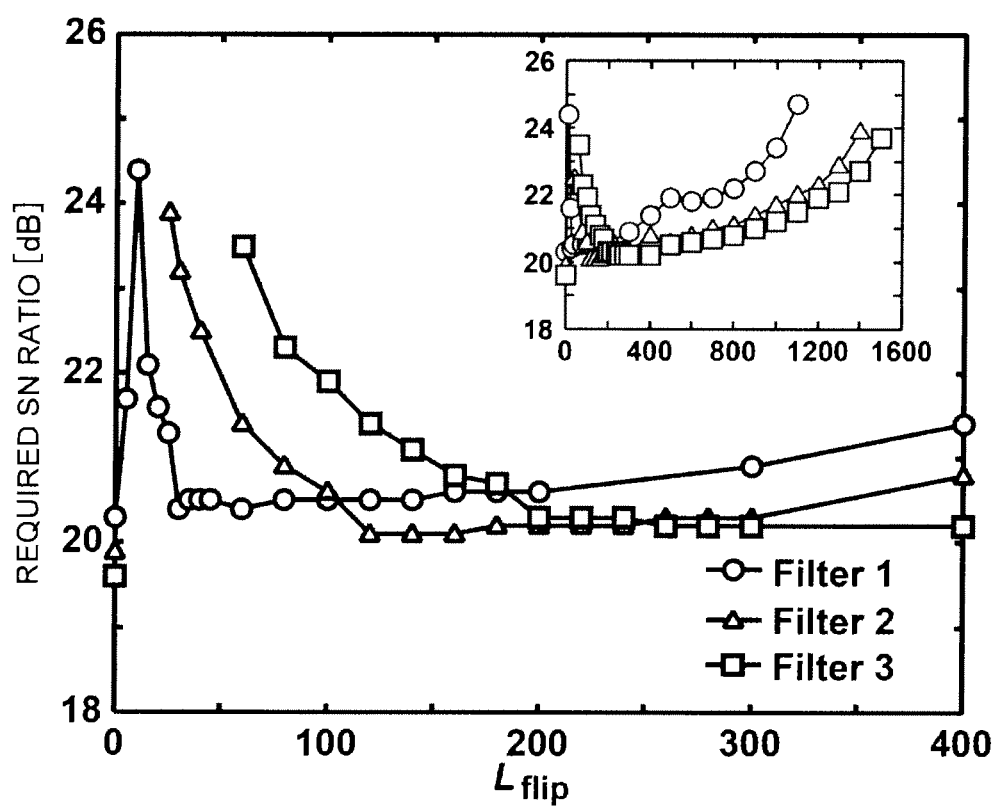
FIG. 24 is a diagram illustrating a relationship between a required SN ratio and $L_{flip}$ for decoding predetermined data without errors when three kinds of two-stage MA filters are individually applied.

FIG. 24 is a diagram illustrating a relationship between a required SN ratio and $L_{flip}$ for decoding predetermined data without errors when three kinds of two-stage MA filters are individually applied. In this case, it is assumed that the total number of user data is 10M bits, K=1.5, $R_J$=80%, $x_h$=0.4, $N_t=N_{topt}$, $L_c$=5, $i_{sp}$=5, $i_{in}$=5. $W_{La}$=0 and $TH_{flip}$=0.12. In the drawing, ○ (white circle), △ (white triangle), and □ (white square) marks respectively indicate the characteristics when the filter 1, the filter 2, and the filter 3 are applied. The portion that does not have a notation in the diagram indicates that an error exists due to an error floor or the like even if an SN ratio reaches 26 dB. It turns out from the diagram that decoding can be performed on the burst of $L_{flip}\le1100$ without errors when the filter 1 is applied. However, it turns out that a required SN ratio is significantly bad for a burst length in the case of $L_{flip}<40$ and $400<L_{flip}$. This reason is that the false detection of burst increases. Moreover, it turns out that decoding can be performed on the burst of $25\le L_{flip}\le1400$ without errors when the filter 2 is applied and decoding can be performed on the burst of $60\le L_{flip}\le1500$ without errors when the filter 3 is applied. Furthermore, it turns out that good characteristics are obtained by using the filter 1 in the case of $L_{flip}<120$, the filter 2 in the case of $120\le L_{flip}<260$, and the filter 3 in the case of $260\le L_{flip}$.

Figure 25:
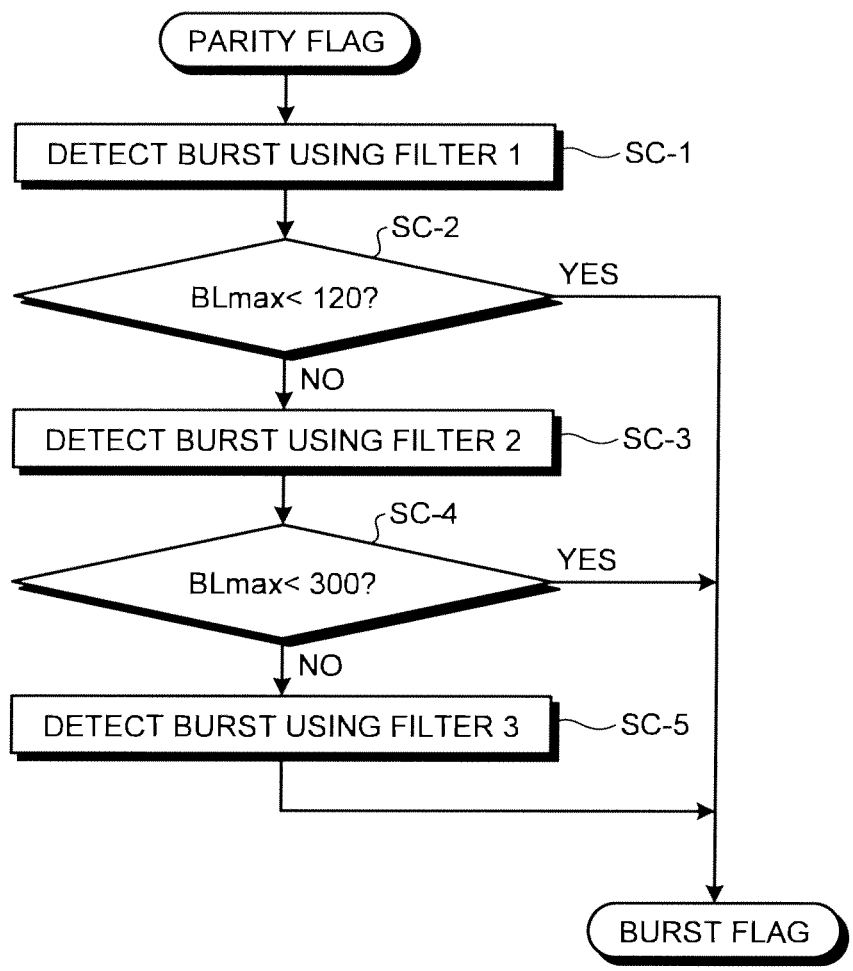
FIG. 25 is a flowchart illustrating an example of a process that is performed by the filter 613'.

FIG. 25 is a flowchart illustrating an example of a process that is performed by the filter 613' proposed in the present embodiment 1-4. As illustrated in FIG. 25, there is proposed a method for applying burst information respectively created by the filter 1, the filter 2, and the filter 3 when the burst length $BL_{max}$ that is longest detected by three kinds of filters is $BL_{max}<120$, $120\le BL_{max}<300$, and $300\le BL_{max}$. In this way, resistance characteristics to comparatively short burst that cannot be detected by the burst detector that includes only the two-stage MA filter of the conventional $L_{MA1}=100$ and $L_{MA2}=200$ are obtained by separating the two-stage MA filter by using the $BL_{max}$.

Figure 26:
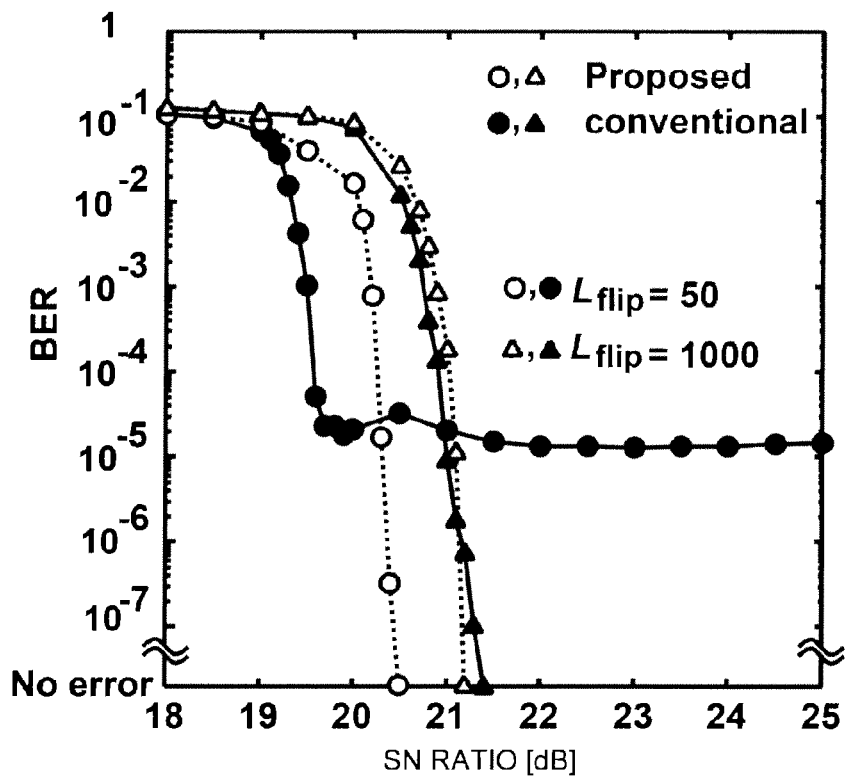
FIG. 26 is a diagram illustrating error rate characteristics of an LDPC coding and iterative decoding system.

FIG. 26 is a diagram illustrating error rate characteristics of an LDPC coding and iterative decoding system (LDPC-PCBD system). In this case, it is assumed that K=1.5, $R_J$=80%, $x_h$=0.4, $N_t=N_{topt}$, $L_c$=5, $i_{sp}$=5, $i_{in}$=5, $W_{La}$=0~0.7 and the total number of user data is 10M bits. Moreover, it is assumed that a threshold value for detecting burst is $TH_{flip}$=0.12. In the drawing, circle marks (○, ●) and triangle marks (△, ▲) respectively indicate the cases of $L_{flip}$=50 and $L_{flip}$=1000. Moreover, white marks (○, △) indicate the characteristic of an improved LDPC-PCBD system that includes the burst detector proposed in the present embodiment 1-4 and black marks (●, ▲) indicate the characteristic of a non-improved LDPC-PCBD system that includes the burst detector of only the MA filter of $L_{MA1}=100$ and $L_{MA2}=200$ of the embodiment 1-1. It turns out from the diagram that the burst detector of the non-improved LDPC-PCBD system according to the embodiment 1-1 cannot detect burst to generate an error floor when a signal burst of $L_{flip}$=50 occurs. However, it turns out from that the burst detector of the improved LDPC-PCBD system according to the present embodiment 1-4 can decode burst with SNR=20.5 dB without errors. Moreover, when a signal burst of $L_{flip}$=1000 occurs, the burst detector of the non-improved LDPC-PCBD system can decode burst with 21.5 dB and the burst detector of the improved LDPC-PCBD system can also decode burst with 21.2 dB without errors to have the substantially same characteristic. This reason is that the burst detector of the improved LDPC-PCBD system proposed in the present embodiment 1-4 has the same configuration of MA filter as that of the non-improved LDPC-PCBD system in most sectors because the longest burst length $BL_{max}$ exceeds 300 channel bits even if the burst detector of the improved LDPC-PCBD system is used.

Figure 27:
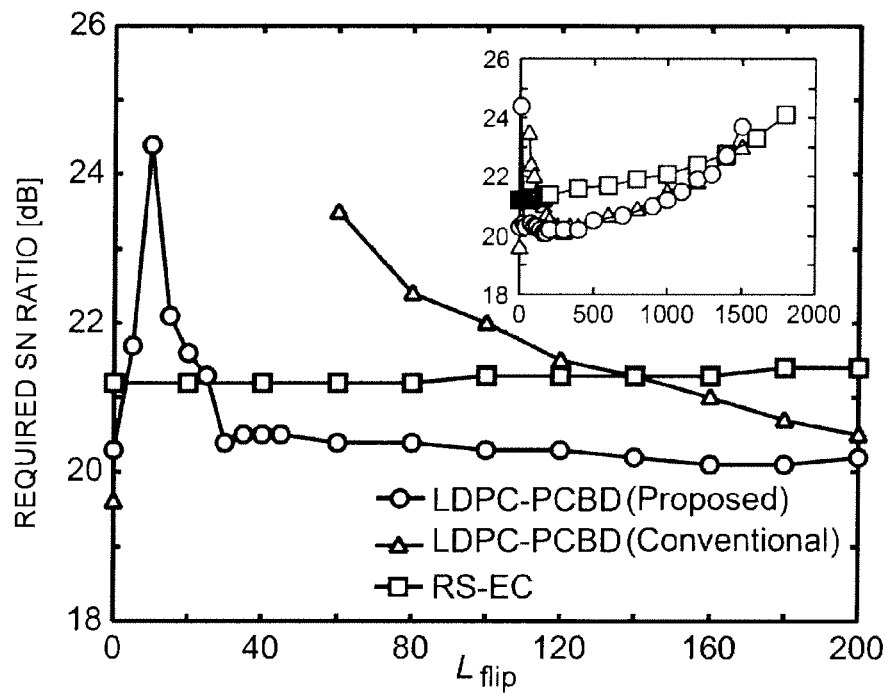
FIG. 27 is a diagram illustrating a relationship between a required SN ratio and $L_{flip}$ for decoding predetermined data without errors.

FIG. 27 is a diagram illustrating a relationship between a required SN ratio and $L_{flip}$ for decoding predetermined data without errors. The parameters used in a simulation are the same those of FIG. 26. In the drawing, ○ (white circle), △ (white triangle), and □ (white square) marks respectively indicate the characteristics of the improved LDPC-PCBD system that includes the burst detector proposed in the present embodiment 1-4, the non-improved LDPC-PCBD system that includes the burst detector proposed in the embodiment 1-1, and the RS-EC system that performs erasure error correction used as a comparison method ([12]Yasuaki Nakamura, Mitsuhiro Nishimura, Yosihiro Okamoto, Hisashi Osawa, Hiroaki Muraoka, and Yoshihisa Nakamura, "A study of correction capability of LDPC code in perpendicular magnetic recording and reproducing system with burst", IEICE technical report, MR2007-23, October 2007). In this case, because an RS code used in the RS-EC system is a code (idem) for which a 190-code-symbol error correction of using a Galois field of $GF(2^{12})$ can be performed and erasure position information is decided by using the amplitude fluctuation of the output of an equalizer, a bit-flipping-like signal burst cannot be detected and erasure correction is not performed. It turns out from the diagram that the improved LDPC-PCBD system that uses the burst detector proposed in the present embodiment 1-4 is also resistant to a signal burst of which $L_{flip}$ is shorter than 60, which cannot be decoded by the non-improved LDPC-PCBD system without errors. Furthermore, it turns out that a signal burst can be permitted with an SN ratio lower than that of the conventional system in the case of $L_{flip}\le1000$. Moreover, it turns out that the proposed system can decode burst with a low SN ratio by about 0.7 dB or more without errors compared to the RS-EC system in the case of $30\le L_{flip}<120$ and can decode burst with a low SN ratio by about 1.0 dB or more without errors compared to the RS-EC system in the case of $120\le L_{flip}<1000$. Because the proposed system has a characteristic inferior to that of the RS-EC system in the case of $L_{flip}\le30$, it is considered that the further improvement of an MA filter is required.

As described above, according to the present embodiment 1-4, there is studied the configuration of the burst detector that uses a detectable LDPC code check matrix even when a short bit-flipping-like signal burst not more than 50 channel bits occurs. Moreover, in the magnetic recording and reproducing system that generates a bit-flipping-like signal burst, performance comparison between the LDPC coding and iterative decoding system (improved LDPC-PCBD) that includes the burst detector proposed in the present embodiment 1-4, the LDPC coding and iterative decoding system (non-improved LDPC-PCBD) that includes the burst detector of the embodiment 1-1, and the RS coding erasure error correction system (RS-EC system) is performed by computer simulation. As a result, it became clear that the LDPC coding and iterative decoding system (improved LDPC-PCBD) that uses the burst detector proposed in the present embodiment 1-4 can permit burst of which the bit flipping length $L_{flip}$ is shorter than 50. Moreover, when burst of which the length $L_{flip}$ is shorter than 300 occurs, the burst detector of the improved LDPC-PCBD system can permit burst with a low SN ratio compared to the non-improved LDPC-PCBD system. Furthermore, it became clear that the burst detector of the improved LDPC-PCBD system could permit burst with about 1 dB or more low SN ratio compared to the RS coding erasure error correction system (RS-EC system) in the case of $120\le L_{flip}<1000$.

As above, the explanations of the embodiments 1-1 to 1-4 are finished. As described above, according to the first embodiment, it is confirmed that an LDPC code that functions as an error correction code for a hard disk drive is applied to the present invention and thus the present invention can correspond to sufficient-length burst by computer simulation. Moreover, it is confirmed by computer simulation that the present invention can be used for the detection of asynchronous writing that becomes a problem in the next-generation hard disk drive that uses a bit pattern medium.

Second Embodiment

Hereinafter, it will be explained about the second embodiment in which the decoder according to the present embodiment is applied to a receiving device.

Figure 28:
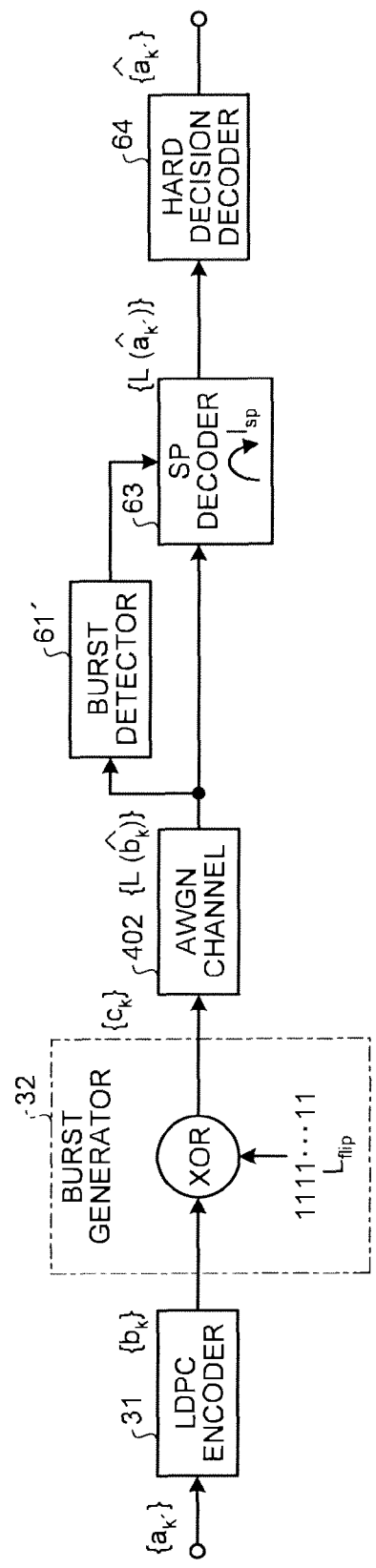
FIG. 28 is a block diagram illustrating an LDPC coding and iterative decoding system that includes a burst detector that uses a parity check matrix of an LDPC code that is applied to a binary-input additive white Gaussian noise channel.

FIG. 28 is a block diagram illustrating an LDPC coding and iterative decoding system (LDPC-PCBD system) that includes a burst detector that uses a parity check matrix of an LDPC code that is applied to a binary-input additive white Gaussian noise (AWGN) channel. As illustrated in FIG. 28, an input data sequence $\{a_{k'}\}$ is encoded by the LDPC encoder in an LDPC coding scheme in a sector unit to be $\{b_k\}$. In this case, an LDPC code is a code of a row degree 22 and a column degree 3 that is the same as the LDPC code that is used in the magnetic recording and reproducing system. Moreover, the information length of the LDPC code is 32768. Furthermore, the second embodiment assumes a bit-flipping-like signal burst as errors that cannot be also detected by the binary-input AWGN channel. This is realized by computer simulation by flipping $\{b_k\}$ over the length $L_{flip}$ standardized by the user bit interval $T_b$. Then, a recording sequence $\{c_k\}$ including a bit-flipping-like error is transmitted to the binary-input AWGN channel only once for each sector. In this case, in the binary-input AWGN channel, a code word of a binary linear code is converted by a binary-bipolar converter and then is transmitted to the channel during transmission ([1] Tadashi Wadayama, "Low density parity check codes and the sum-product algorithm", Triceps, June 2002).

An SN ratio in the binary-input AWGN channel is defined by the following equation (idem).

$$SNR = 10\log_{10}\frac{E_b}{N_0} \; [dB] \quad (5)$$

In this case, $E_b$ indicates transmission energy per a 1-bit information symbol and $N_0$ indicates a one-side power spectrum density of a white Gaussian noise. Similarly to the case of the magnetic recording and reproducing system, burst is not included in the SN ratio of Equation (5).

In the binary-input AWGN channel, the channel output $\{L(\hat{b}_k)\}$ is considered as a reliability and decoding is performed. The $\{L(\hat{b}_k)\}$ is input into the SP decoder 63 and the burst detector 61'. The burst detector 61' detects the position and length of burst from $\{L(\hat{c}_k)\}$ by using the parity check matrix of an LDPC code and supplies the position and length to the SP decoder 63 as burst information. A burst detection method is performed in the same manner as the detection method of the magnetic recording and reproducing system described above. The SP decoder 63 repeats SP decoding that considers the burst information by the predetermined number of times $i_{sp}$. In this case, the repeat count $i_{sp}$ is five. Then, an output data sequence $\{\hat{a}_{k'}\}$ is obtained by performing a hard decision on $\{L(\hat{a}_{k'})\}$. A bit error rate (BER) characteristic is obtained by comparing the input data sequence and the output data sequence and the performance evaluation of the LDPC coding and iterative decoding system (LDPC-PCBD system) is performed.

Figure 29:
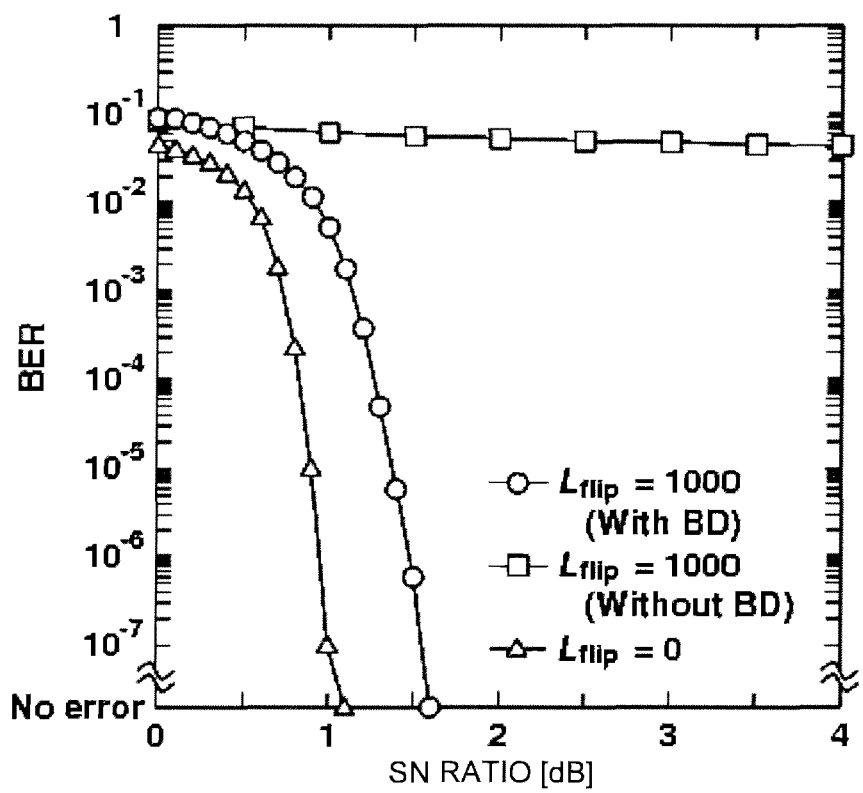
FIG. 29 is a diagram illustrating a BER characteristic in a binary-input AWGN channel.

FIG. 29 is a diagram illustrating a BER characteristic in a binary-input AWGN channel. In this case, it is assumed that $L_{flip}$=1000. In the drawing, ○ (white circle) and □ (white square) marks respectively indicate the cases where a burst detector is used and is not used. Moreover, Δ (white triangle) mark indicates a characteristic in the case of $L_{flip}$=0 as reference. It turns out from FIG. 29 that although an error rate shows a saturation trend when a burst detector is not used, decoding can be performed with about 1.6 dB without errors by using the burst detector. Moreover, it turns out that the degradation of an SN ratio can be suppressed to about 0.5 dB by using the burst detector compared with a characteristic when a signal burst does not occur.

As above, the explanation of the second embodiment is finished. In this way, according to the present second embodiment, it is confirmed that the detection of a burst error can be performed by computer simulation in the binary-input additive white Gaussian noise channel and the present invention can be used for the detection of a burst error in wire and wireless communication.

Other Embodiments

The embodiments of the present invention have been described above. However, the present invention may be executed in not only the embodiment described above but also various different embodiments within the technical idea described in the scope of claims.

In the embodiments, it has been explained about the case where the present invention is applied to a magnetic recording and reproducing device and a communication device. However, the present invention is not limited to this. The present invention can be widely applied to digital signal processing of a recording device such as a magnetic disk unit, a storage product such as an optical disc, and a communication field such as a wireless LAN, wireless Internet, or long-distance optical communication. Particularly, the present invention is extremely useful for asynchronous writing detection for a next-generation hard disk drive that uses a bit pattern medium, burst error detection in communication, burst error detection for a semiconductor memory, and the like, in addition to an error correction for a hard disk drive described above.

Moreover, in the embodiments, it has been explained about the case where the decoder 60 has the configuration of combining the APP decoder 62 and the SP decoder 63. However, the present invention is not limited to this. The decoder 60 may use a well-known decoding means that can perform decoding on an LDPC code, or may have the configuration of combining soft-output and soft-input inner and outer decoders that use likelihood.

Moreover, in the embodiments, it has been explained about a method of using weighting as a method for suppressing the rise of likelihood. However, the present invention is not limited to this. For example, the rise of likelihood may be suppressed by masking a likelihood corresponding to the position and length of the detected burst errors by a constant repeat count.

In the embodiments, the case where the decoder 60 performs the process in the form of stand-alone device is explained as one example. However, the decoder 60 may be configured to perform the process according to a request from a client terminal which is provided separately from these apparatuses.

Of each of the processes explained in the embodiment, all or some processes explained to be automatically performed may be manually performed. Alternatively, all or some processes explained to be manually performed can also be automatically performed by a known method.

In addition, the procedures, the control procedures, the specific names, the information including parameters such as registered data, and the database configurations which are described in the literatures or the drawings can be arbitrarily changed unless otherwise noted.

With respect to the decoder 60, the constituent elements shown in the drawings are functionally schematic. The constituent elements need not be always physically arranged as shown in the drawings.

For example, all or some processing functions of the devices in the decoder 60, especially control functions (decoding unit and burst detecting unit) can be realized by a CPU (Central Processing Unit) and a program interpreted and executed by the CPU or can also be realized by hardware realized by a wired logic. The program is recorded on a recording medium (will be described later) and mechanically read by the decoder 60 as needed. More specifically, on the storage unit such as a ROM or an HD, a computer program which gives an instruction to the CPU in cooperation with an OS (Operating System) to perform various process is recorded. The computer program is executed by being loaded on a RAM, and constitutes a control unit in cooperation with the CPU.

The computer program may be stored in a application program server connected to the decoder 60 via arbitrary network, and all or some of the program can be downloaded as needed.

A program according to the present invention may be stored in a computer-readable recording medium. The "recording medium" includes an arbitrary "portable physical medium" such as a flexible disk, a magnet-optical disk, a ROM, an EPROM, an EEPROM, a CD-ROM, an MO, or a DVD or a "communication medium" such as a communication line or a carrier wave which holds a program for a short period of time when the program is transmitted through a network typified by a LAN, a WAN, and the Internet.

The "program" is a data processing method described in an arbitrary language or a describing method. As a format of the "program", any format such as a source code or a binary code may be used. The "program" is not always singularly constructed, and includes a program obtained by distributing and arranging a plurality of modules or libraries or a program that achieves the function in cooperation with another program typified by an OS (Operating System). In the apparatuses or the device according to the embodiments, as a specific configuration to read a recording medium, a read procedure, an install procedure used after the reading, and the like, known configurations and procedures can be used.

Various databases and so on stored in the memory unit is a storage unit such as memory device like ROM or RAM, fixed disk device like hard disk, or storage means like flexible disk and optical disk, and stores various programs, tables, and databases, used for various processings.

The decoder 60 may be realized by connecting a known information processing apparatus such as a personal computer or a workstation and installing software (including a program, data, or the like) which causes the information processing apparatus to realize the method according to the present invention.

Furthermore, a specific configuration of distribution and integration of the devices is not limited to that shown in the drawings. All or some devices can be configured such that the devices are functionally or physically distributed and integrated in arbitrary units depending on various additions or functional load.

INDUSTRIAL APPLICABILITY

As described above in detail, according to the embodiments of the present invention, because the present invention can provide the decoder, the perpendicular magnetic recording and reproducing device, the receiving device, and the decoding method that are used for decoding resistant to burst errors that do not have amplitude fluctuation like a pole-erase phenomenon without adding a special code (redundant code) for detecting burst errors, the present invention is extremely useful for various fields such as a next-generation magnetic recording and reproducing system, a semiconductor field, storage and memory fields, or an information communication field.

The invention claimed is:

1. A decoder that performs a decoding process on an encoded data signal, the decoder comprising:
    a burst detecting unit that performs a parity check on the encoded data signal that is encoded with at least a low density parity check code, detects and outputs burst information only using the low density parity check code,
    wherein the burst information includes information by which a position and a length of a burst error of the encoded data signal are specified, and
    wherein the burst detecting unit performs the parity check on the encoded data signal for each row of a parity check matrix, adds up a number of bits "1" of a row detected as an error in the parity check for each column of the parity check matrix corresponding to bits of the encoded data signal, specifies the position and the length of the burst error of the encoded data signal in accordance with a distribution of an added-up number, and generates and outputs the burst information.

2. The decoder according to claim 1, further comprising a decoding unit that suppresses a rise of a likelihood of each bit of the encoded data signal corresponding to the position and the length of the burst error to perform an iterative decoding process based on the burst information output from the burst detecting unit.

3. The decoder according to claim 2, wherein the burst detecting unit includes:
    a hard decision unit that performs a hard decision on a decoded result output from the decoding unit;
    a parity flag generating unit that performs a parity check on the decoded result hard-decided by the hard decision unit based on a parity check matrix and generates a parity flag;
    a filter output unit that applies the parity flag generated from the parity flag generating unit to a moving average filter to output a filter output; and
    a burst information output unit that performs a threshold decision on the filter output of the filter output unit to specify the position and the length of the burst error and outputs the burst information to the decoding unit.

4. The decoder according to claim 3, wherein the filter output unit applies the parity flag to moving average filters through multiple stages.

5. The decoder according to claim 3, wherein the filter output unit applies the parity flag to the moving average filter that outputs a moving average of an interval longer than that of an applied moving average filter to again output a filter output when the length of the burst error specified by performing the threshold decision on the filter output by the burst information output unit is not less than a predetermined value.

6. The decoder according to claim 2, wherein the decoding unit includes:
   an APP (a posteriori probability) decoder that performs a posteriori probability decoding process on the encoded data signal and outputs a decoded result including the likelihood; and
   an SP (sum-product) decoder that suppresses the rise of the likelihood output from the APP decoder based on the burst information output from the burst detecting unit, performs the iterative decoding process on the decoded result output from the APP decoder, and outputs a decoded result including the updated likelihood as an input of the APP decoder.

7. The decoder according to claim 6, wherein the SP decoder suppresses the rise of the likelihood output from the APP decoder by using weighting based on the burst information.

8. The decoder according to claim 2, wherein
   the encoded data signal is further encoded with an RS (Reed-Solomon) code, and
   the decoder further includes an RS decoder that performs decoding of the RS code on the output of the decoding unit.

9. The decoder according to claim 1, wherein the burst error is caused by an effect that a medium defect and a bit-flipping-like signal burst occur at the same time.

10. A perpendicular magnetic recording and reproducing device including the decoder according to claim 1.

11. A receiving device including the decoder according to claim 1.

12. A decoding method for performing a decoding process on an encoded data signal, the method comprising:
   a burst detecting step of performing a parity check on the encoded data signal that is encoded with at least a low density parity check code, detecting and outputting burst information only using the low density parity check code,
   wherein the burst information includes information by which a position and a length of a burst error of the encoded data signal are specified, and
   wherein at the burst detecting step, the parity check on the encoded data signal is performed for each row of a parity check matrix, a number of bits "1" of a row detected as an error in the parity check is added up for each column of the parity check matrix corresponding to bits of the encoded data signal, the position and the length of the burst error of the encoded data signal are specified in accordance with a distribution of an added-up number, and the burst information is generated and output.

13. The decoding method according to claim 12, further comprising a decoding step of suppressing a rise of a likelihood of each bit of the encoded data signal corresponding to the position and the length of the burst error to perform an iterative decoding process based on the burst information output at the burst detecting step.

14. The decoding method according to claim 13, wherein the burst detecting step includes:
   a hard decision step of performing a hard decision on a decoded result output at the decoding step;
   a parity flag generating step of including performing a parity check on the decoded result hard-decided at the hard decision step based on a parity check matrix and generating a parity flag;
   a filter output step of applying the parity flag generated at the parity flag generating step to a moving average filter to output a filter output; and
   a burst information output step of including performing a threshold decision on the filter output of the filter output step to specify the position and the length of the burst error and outputting the burst information to the decoding step.

15. The decoding method according to claim 14, wherein at the filter output step, the parity flag is applied to moving average filters through multiple stages.

16. The decoding method according to claim 14, wherein at the filter output step, the parity flag is applied to the moving average filter that outputs a moving average of an interval longer than that of an applied moving average filter to again output a filter output when the length of the burst error specified by performing the threshold decision on the filter output of the burst information output step is not less than a predetermined value.

17. The decoding method according to claim 13, wherein the decoding step includes:
   an APP (a posteriori probability) decoding step of performing a posteriori probability decoding process on the encoded data signal to output a decoded result including the likelihood; and
   an SP (sum-product) decoding step of including suppressing the rise of the likelihood output at the APP decoding step based on the burst information output at the burst detecting step, performing the iterative decoding process on the decoded result output at the APP decoding step, and outputting a decoded result including the updated likelihood as an input of the APP decoding step.

18. The decoding method according to claim 17, wherein at the SP decoding step, the rise of the likelihood output from the APP decoding is suppressed by using weighting based on the burst information.

19. The decoding method according to claim 13, wherein the encoded data signal is further encoded with an RS (Reed-Solomon) code, and the decoding step further includes an RS decoding step of decoding the RS code on the output of the decoding step.

20. The decoding method according to claim 12, wherein the burst error is caused by an effect that a medium defect and a bit-flipping-like signal burst occur at the same time.

* * * * *